(12) United States Patent
Kumagai

(10) Patent No.: US 12,382,197 B2
(45) Date of Patent: Aug. 5, 2025

(54) SOLID-STATE IMAGING ELEMENT, ELECTRONIC DEVICE, AND CONTROL METHOD OF SOLID-STATE IMAGING ELEMENT

(71) Applicant: SONY SEMICONDUCTOR SOLUTIONS CORPORATION, Kanagawa (JP)

(72) Inventor: Yoshimichi Kumagai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 104 days.

(21) Appl. No.: 18/251,865

(22) PCT Filed: Oct. 27, 2021

(86) PCT No.: PCT/JP2021/039606
§ 371 (c)(1),
(2) Date: May 4, 2023

(87) PCT Pub. No.: WO2022/102404
PCT Pub. Date: May 19, 2022

(65) Prior Publication Data
US 2023/0412944 A1 Dec. 21, 2023

(30) Foreign Application Priority Data
Nov. 12, 2020 (JP) .................... 2020-189018

(51) Int. Cl.
*H04N 25/77* (2023.01)
*H10F 39/00* (2025.01)
*H10F 39/18* (2025.01)

(52) U.S. Cl.
CPC ....... *H04N 25/77* (2023.01); *H10F 39/80373* (2025.01); *H10F 39/18* (2025.01)

(58) Field of Classification Search
CPC .... H04N 25/77; H04N 25/621; H04N 25/771; H01L 27/14614; H01L 27/14643; H01L 27/14612; H01L 27/146
See application file for complete search history.

(56) References Cited

U.S. PATENT DOCUMENTS

| | | | |
|---|---|---|---|
| 2018/0054579 A1* | 2/2018 | Kumagai | .......... H01L 27/14643 |
| 2020/0219926 A1* | 7/2020 | Seto | .................... H01L 27/1461 |

FOREIGN PATENT DOCUMENTS

| | | |
|---|---|---|
| JP | 2011-199816 A | 10/2011 |
| JP | 2016-201449 A | 12/2016 |

(Continued)

OTHER PUBLICATIONS

International Search Report and Written Opinion of PCT Application No. PCT/JP2021/039606, issued on Jan. 25, 2022, 09 pages of ISRWO.

*Primary Examiner* — Yogesh K Aggarwal
(74) *Attorney, Agent, or Firm* — CHIP LAW GROUP

(57) ABSTRACT

Provided is a solid-state imaging element that includes a photoelectric conversion unit, a transfer transistor, and an internal gate. The photoelectric conversion unit photoelectrically converts incident light. The transfer transistor transfers a charge generated by the photoelectric conversion unit. The internal gate is disposed adjacent to the transfer transistor inside the photoelectric conversion unit and deepens the potential of at least a partial region in the photoelectric conversion unit.

8 Claims, 27 Drawing Sheets

(56) References Cited

FOREIGN PATENT DOCUMENTS

| JP | 2017-076899 A | 4/2017 |
| JP | 2020-021987 A | 2/2020 |
| JP | 2020-113823 A | 7/2020 |

\* cited by examiner

SOLID-STATE IMAGING ELEMENT, ELECTRONIC DEVICE, AND CONTROL METHOD OF SOLID-STATE IMAGING ELEMENT

CROSS REFERENCE TO RELATED APPLICATIONS

This application is a U.S. National Phase of International Patent Application No. PCT/JP2021/039606 filed on Oct. 27, 2021, which claims priority benefit of Japanese Patent Application No. JP 2020-189018 filed in the Japan Patent Office on Nov. 12, 2020. Each of the above-referenced applications is hereby incorporated herein by reference in its entirety.

FIELD

The present disclosure relates to a solid-state imaging element, an electronic device, and a control method of the solid-state imaging element.

BACKGROUND

In recent years, in solid-state imaging elements used in an image sensor of a camera or the like, a configuration capable of securing a larger saturation charge amount of a photoelectric conversion unit has been proposed (see, for example, Patent Literature 1).

CITATION LIST

Patent Literature

Patent Literature 1: JP 2011-199816 A

SUMMARY

Technical Problem

However, in the above-described conventional technology, there is room for further improvement in improving the saturation charge amount of a photoelectric conversion unit.

Therefore, the present disclosure proposes a solid-state imaging element, an electronic device, and a control method of the solid-state imaging element capable of improving the saturation charge amount of a photoelectric conversion unit.

Solution to Problem

According to the present disclosure, there is provided a solid-state imaging element. The solid-state imaging element includes a photoelectric conversion unit, a transfer transistor, and an internal gate. The photoelectric conversion unit photoelectrically converts incident light. The transfer transistor transfers a charge generated by the photoelectric conversion unit. The internal gate is disposed adjacent to the transfer transistor inside the photoelectric conversion unit and deepens the potential of at least a partial region in the photoelectric conversion unit.

DESCRIPTION OF EMBODIMENTS

Hereinafter, embodiments of the present disclosure will be described in detail on the basis of the drawings. Note that in each of the following embodiments, the same parts are denoted by the same symbols, and redundant description will be omitted.

In recent years, in solid-state imaging elements used in an image sensor of a camera or the like, a configuration capable of securing a larger saturation charge amount of a photoelectric conversion unit has been proposed.

However, in a solid-state imaging element in which the area of a photoelectric conversion unit itself is small, such as a so-called global shutter type solid-state imaging element in which the photoelectric conversion unit and a charge holding unit are divided on a plane of a light receiving pixel, there are cases where the saturation charge amount of the photoelectric conversion unit decreases.

Moreover, there is a possibility that the dynamic range of the solid-state imaging element is reduced due to a decrease in the saturation charge amount of the photoelectric conversion unit.

Therefore, it is desired to implement technology capable of overcoming the above problems and improving the saturation charge amount of a photoelectric conversion unit.

[Configuration of Solid-State Imaging Element]

Figure 1:
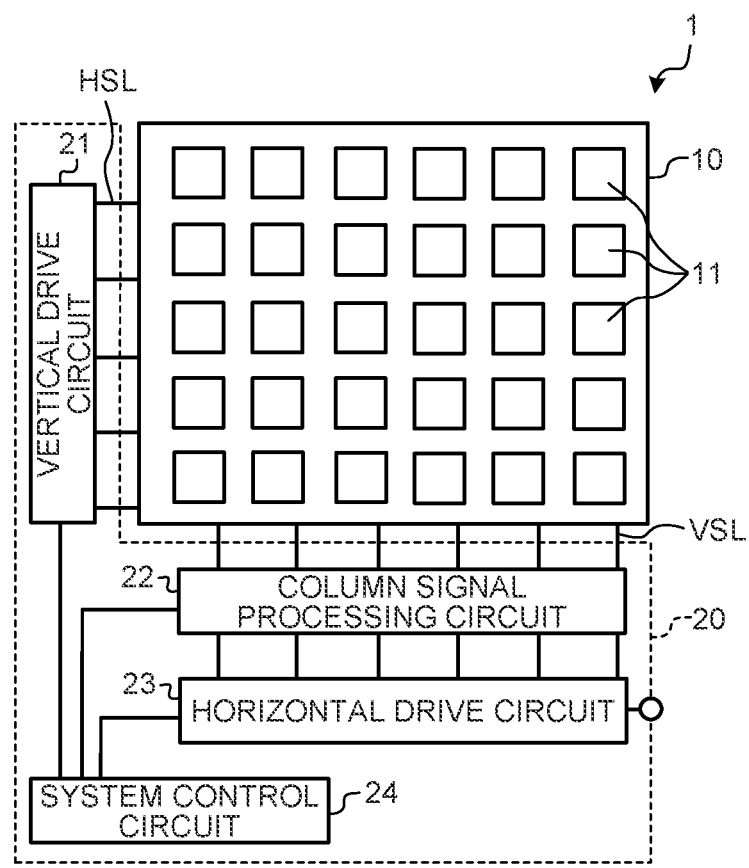
FIG. 1 is a system configuration diagram illustrating a schematic configuration example of a solid-state imaging element according to each of embodiments of the present disclosure.

First, the configuration of a solid-state imaging element 1 according to each embodiment will be described with reference to FIG. 1. FIG. 1 is a system configuration diagram illustrating a schematic configuration example of the solid-state imaging element 1 according to each embodiment of the present disclosure.

As illustrated in FIG. 1, the solid-state imaging element 1 according to each embodiment includes a pixel array unit 10 and a logic circuit 20. The pixel array unit 10 includes a plurality of light receiving pixels 11 and a plurality of readout circuits 12 (see FIG. 2).

The light receiving pixel 11 performs photoelectric conversion and outputs a charge corresponding to the amount of received light. The plurality of light receiving pixels 11 is arranged in a matrix shape in the pixel array unit 10. Note that, in the following description, a light receiving pixel 11 is also simply referred to as a "pixel" or a "unit pixel".

A readout circuit 12 outputs a pixel signal based on a charge output from a light receiving pixel 11. For example, in the pixel array unit 10, one of a plurality of readout circuits 12 is provided for every light receiving pixel 11. Note that one of the plurality of readout circuits 12 may be provided for a plurality of light receiving pixels 11 in the pixel array unit 10.

A plurality of pixel drive lines HSL and a plurality of data output lines VSL are connected between the pixel array unit 10 and the logic circuit 20. A pixel drive line HSL is wiring by which a control signal for controlling output of a charge accumulated in a light receiving pixel 11 is applied and extends, for example, in a row direction.

A data output line VSL is wiring that outputs a pixel signal output from each readout circuit 12 to the logic circuit 20 and extends, for example, in a column direction.

The logic circuit 20 includes, for example, a vertical drive circuit 21, a column signal processing circuit 22, a horizontal drive circuit 23, and a system control circuit 24. The logic circuit 20 outputs an output voltage for each light receiving pixel 11 to an external device, thereby providing image data to the external device.

The vertical drive circuit 21 sequentially selects a plurality of light receiving pixels 11 for every row of a predetermined unit number of pixels. The "row of a predetermined unit number of pixels" refers to a pixel row in which the pixels can be selected with the same address. For example, in a case where one light receiving pixel 11 is allocated to one readout circuit 12, the "row of a predetermined unit number of pixels" refers to a row of one pixel.

Furthermore, for example, in a case where the plurality of light receiving pixels 11 shares one readout circuit 12, and the layout of the plurality of light receiving pixels 11 sharing this readout circuit 12 is two-pixel rows×n-pixel columns (n is an integer greater than or equal to 1), the "row of a predetermined unit number of pixels" refers to a two-pixel row.

Furthermore, for example, in a case where a plurality of light receiving pixels 11 sharing one readout circuit 12 has a layout of four-pixel rows×n-pixel columns (n is an integer greater than or equal to 1), the "row of a predetermined unit number of pixels" refers to a four-pixel row.

The vertical drive circuit 21 controls transfer transistors TY and TRG, a discharge transistor OFG, internal gates PY and TX (see FIG. 2), and others in each of the light receiving pixels 11 via a pixel drive line HSL. Furthermore, the vertical drive circuit 21 controls a reset transistor RST, a selection transistor SEL (see FIG. 2), and others in each of the readout circuits 12 via a pixel drive line HSL.

For example, the column signal processing circuit 22 performs correlated double sampling (CDS) processing on a pixel signal output from each light receiving pixel 11 of a row selected by the vertical drive circuit 21. The column signal processing circuit 22 extracts a signal level of a pixel signal by performing, for example, the CDS processing and holds pixel data corresponding to the amount of light received by each light receiving pixel 11.

The column signal processing circuit 22 includes, for example, a column signal processing unit for each data output line VSL. A column signal processing unit includes, for example, a single-slope A/D converter. The single-slope A/D converter includes, for example, a comparator and a counter circuit.

The horizontal drive circuit 23 sequentially outputs, for example, the pixel data held in the column signal processing circuit 22 to the outside. The system control circuit 24 controls driving of each block (the vertical drive circuit 21, the column signal processing circuit 22, and the horizontal drive circuit 23) in the logic circuit 20, for example.

[Circuit Configuration]

Figure 2:
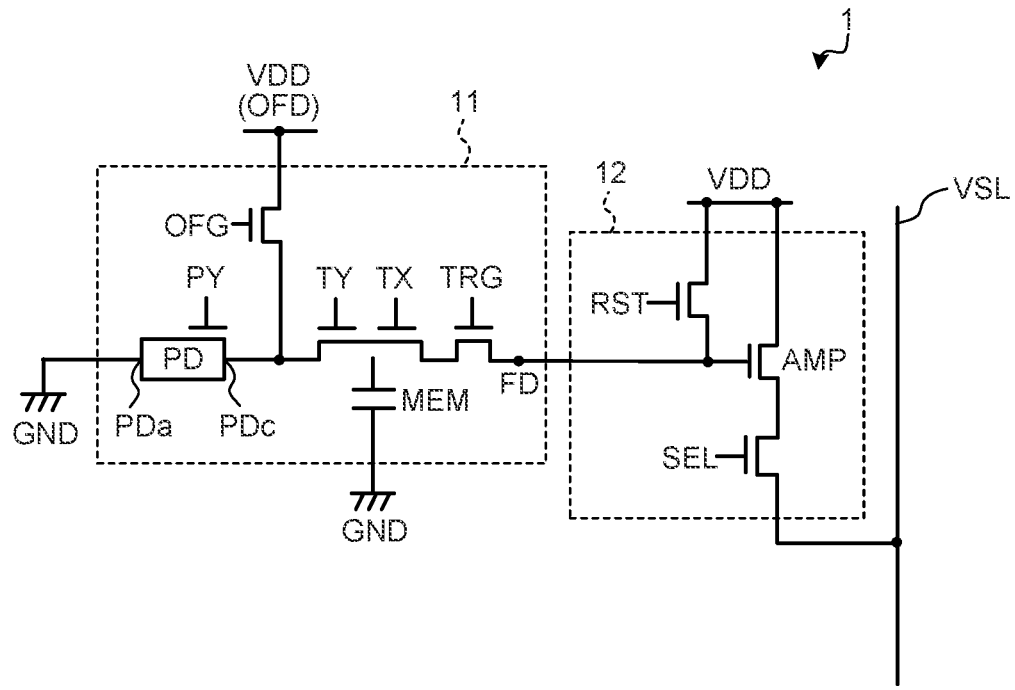
FIG. 2 is a diagram illustrating an example of a circuit configuration of a light receiving pixel and a readout circuit according to a first embodiment of the disclosure.

Next, the circuit configuration of the light receiving pixels 11 and the readout circuits 12 according to the first embodiment will be described with reference to FIG. 2. FIG. 2 is a diagram illustrating an example of a circuit configuration of a light receiving pixel 11 and a readout circuit 12 according to the first embodiment of the disclosure. Note that, in the example of FIG. 2, a case where one light receiving pixel 11 is allocated to one readout circuit 12 is illustrated.

As illustrated in FIG. 2, a light receiving pixel 11 according to the first embodiment includes a photodiode PD, transfer transistors TY and TRG, a charge holding unit MEM, a floating diffusion FD, a discharge transistor OFG, and internal gates PY and TX.

The photodiode PD is an example of a photoelectric conversion unit. The internal gate TX is an example of another internal gate. The transfer transistors TY and TRG and the discharge transistor OFG are, for example, metal oxide semiconductor (NMOS) transistors.

The photodiode PD photoelectrically converts light incident via a light receiving plane. The photodiode PD performs photoelectric conversion to generate a charge corresponding to the amount of received light. The photodiode PD is, for example, a PN junction type photoelectric conversion element.

A cathode PDc of the photodiode PD is electrically connected to the source of the transfer transistor TY, and an anode PDa of the photodiode PD is electrically connected to a reference potential line (for example, ground GND).

The transfer transistor TY is connected between the photodiode PD and the transfer transistor TRG. The transfer transistor TY controls the height of a potential barrier PB1 (see FIG. 7F) in response to a control signal applied to a gate. For example, in a case where the transfer transistor TY is turned on, the height of a potential barrier PB1 decreases (that is, the potential barrier PB1 becomes deep).

On the other hand, in a case where the transfer transistor TY is turned off, the height of the potential barrier PB1 increases (that is, the potential barrier PB1 becomes shallow). Then, in a case where the transfer transistor TY is turned on, charges accumulated in the photodiode PD are transferred to the charge holding unit MEM via the transfer transistor TY.

Furthermore, the transfer transistor TY controls the potential of a partial region in the charge holding unit MEM in response to a control signal applied to the gate. Specifically, in a case where the transfer transistor TY is turned on, the transfer transistor TY deepens the potential of a region adjacent to the potential barrier PB1 in the charge holding unit MEM.

On the other hand, in a case where the transfer transistor TY is turned off, the transfer transistor TY makes the potential of the region, which is adjacent to the potential barrier PB1 in the charge holding unit MEM, shallow.

A drain of the transfer transistor TY is electrically connected to a source of the transfer transistor TRG, and the gate of the transfer transistor TY is connected to a pixel drive line HSL (see FIG. 1).

The charge holding unit MEM is a region that temporarily holds the charges accumulated in the photodiode PD. The charge holding unit MEM holds the charge transferred from the photodiode PD.

The transfer transistor TRG is connected between the transfer transistor TY and the floating diffusion FD. The transfer transistor TRG transfers the charge held in the charge holding unit MEM to the floating diffusion FD in response to a control signal applied to the gate.

For example, in a case where the transfer transistor TRG is turned on, the charge held in the charge holding unit MEM is transferred to the floating diffusion FD via the transfer transistor TRG.

A drain of the transfer transistor TRG is electrically connected to the floating diffusion FD, and the gate of the transfer transistor TRG is connected to a pixel drive line HSL.

The floating diffusion FD is a floating diffusion region that temporarily holds the charge output from the charge holding unit MEM via the transfer transistor TRG. The floating diffusion FD is connected to, for example, the reset transistor RST and is connected to the vertical signal line VSL via an amplification transistor AMP and a selection transistor SEL.

The internal gate PY controls the potential of a partial region in the photodiode PD in response to a control signal applied to the gate. Specifically, in a case where the internal gate PY is turned on, the internal gate PY deepens the potential of the region adjacent to the transfer transistor TY inside the photodiode PD.

On the other hand, in a case where the internal gate PY is turned off, the internal gate PY makes the potential of the region, which is adjacent to the transfer transistor TY inside the photodiode PD, shallow.

The internal gate TX controls the potential of a partial region in the charge holding unit MEM in response to a control signal applied to the gate. Specifically, in a case where the internal gate TX is turned on, the internal gate TX deepens the potential of a region between the transfer transistor TY and the transfer transistor TRG inside the charge holding unit MEM.

On the other hand, in a case where the internal gate TX is turned off, the internal gate TX makes the potential of the region, which is between the transfer transistor TY and the transfer transistor TRG inside the charge holding unit MEM, shallow.

The discharge transistor OFG is connected between the photodiode PD and a power supply line VDD (discharge floating diffusion OFD). The discharge transistor OFG discharges the charges accumulated in the photodiode PD in response to a control signal applied to the gate and initializes (resets) the photodiode PD.

For example, in a case where the discharge transistor OFG is in an ON state, the potential of the photodiode PD is reset to a potential level of the power supply line VDD. That is, the photodiode PD is initialized.

In addition, the discharge transistor OFG forms, for example, an overflow path between the transfer transistor TY and the power supply line VDD and discharges the charge overflowing from the photodiode PD to the power supply line VDD.

A drain of the discharge transistor OFG is connected to the power supply line VDD, a source of the discharge transistor OFG is connected between the photodiode PD and the transfer transistor TY, and a gate of the discharge transistor OFG is connected to a pixel drive line HSL.

The reset transistor RST is connected between the floating diffusion FD and the power supply line VDD. The reset transistor RST discharges charges accumulated in each region from the charge holding unit MEM to the floating diffusion FD in response to a control signal applied to a gate and initializes (resets) the regions.

For example, in a case where the transfer transistor TRG and the reset transistor RST are turned on, the potentials of the charge holding unit MEM and the floating diffusion FD are reset to the potential level of the power supply line VDD.

That is, in a case where the transfer transistor TRG and the reset transistor RST are turned on, the charge holding unit MEM and the floating diffusion FD are initialized.

Meanwhile, in a case where only the reset transistor RST is turned on, the potential of the floating diffusion FD is reset to the potential level of the power supply line VDD. That is, in a case where only the reset transistor RST is turned on, the floating diffusion FD is initialized.

A drain of the reset transistor RST is connected to the power supply line VDD, a source of the reset transistor RST is connected to the floating diffusion FD, and the gate of the reset transistor RST is connected to a pixel drive line HSL.

The amplification transistor AMP serves as an input unit of a source follower circuit that reads a charge obtained by photoelectric conversion in the photodiode PD. Since the source of the amplification transistor AMP is connected to a vertical signal line VSL via the selection transistor SEL, the amplification transistor AMP is included in the source follower circuit together with a constant current source connected to one end of the vertical signal line VSL.

The amplification transistor AMP converts a charge obtained by photoelectric conversion in the photodiode PD into a pixel signal and outputs the pixel signal to the vertical signal line VSL via the selection transistor SEL.

The gate of the amplification transistor AMP is connected to the floating diffusion FD, a drain of the amplification transistor AMP is connected to the power supply line VDD, and a source of the amplification transistor AMP is connected to a drain of the selection transistor SEL.

The selection transistor SEL controls the output of the pixel signal output from the amplification transistor AMP to the vertical signal line VSL in response to a control signal applied to a gate. When the control signal is on, the selection transistor SEL enters a conductive state, and the light receiving pixel 11 coupled to the selection transistor SEL enters a selected state.

Then, when the light receiving pixel 11 enters the selected state, the pixel signal output from the amplification transistor AMP is read out to the column signal processing circuit 22 (see FIG. 1) via the vertical signal line VSL.

The drain of the selection transistor SEL is connected to the source of the amplification transistor AMP, a source of the selection transistor SEL is connected to the vertical signal line VSL, and a gate of the selection transistor SEL is connected to a pixel drive line HSL.

[Configuration of Light Receiving Pixel]

Figure 3:
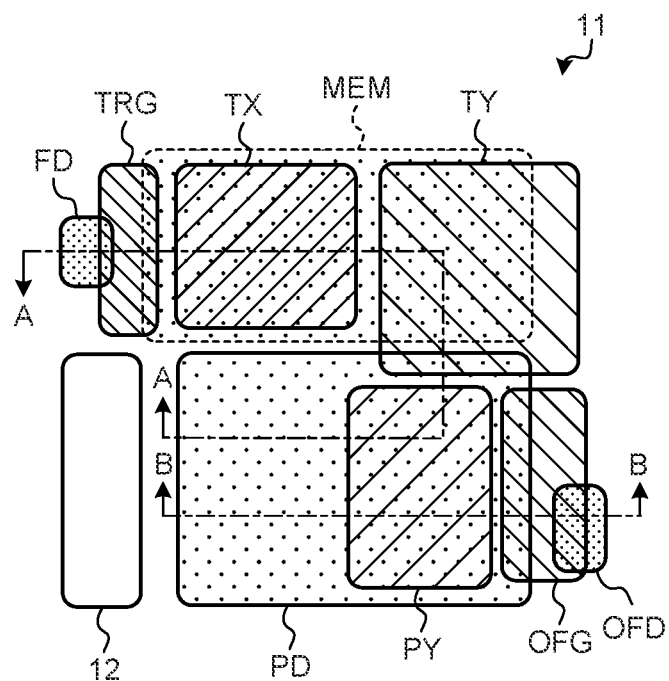
FIG. 3 is a diagram illustrating an example of a planar structure of a light receiving pixel according to the first embodiment of the disclosure.
Figure 4:
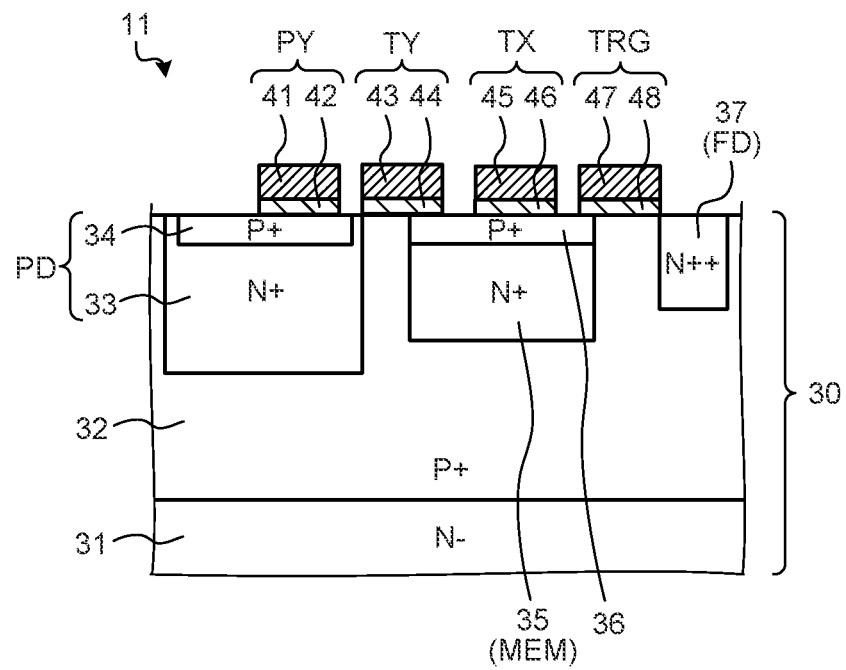
FIG. 4 is a cross-sectional view taken along line A-A illustrated in FIG. 3 as viewed in the direction of arrows.
Figure 5:
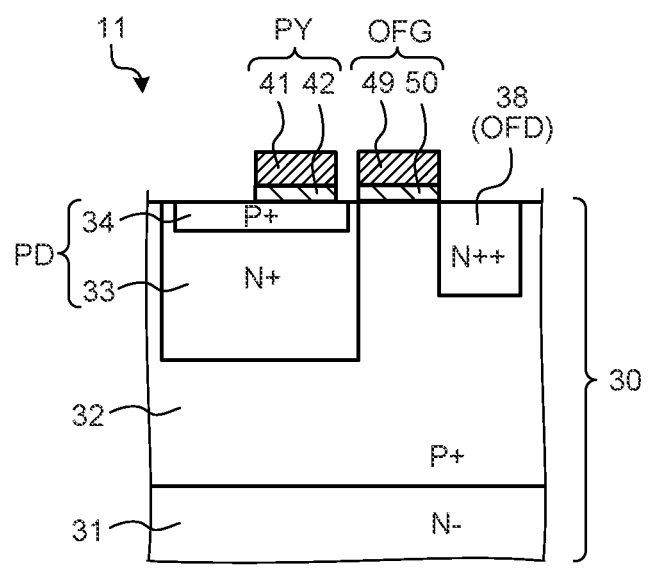
FIG. 5 is a cross-sectional view taken along line B-B illustrated in FIG. 3 as viewed in the direction of arrows.

Next, a planar structure and a cross-sectional structure of a light receiving pixel 11 according to the first embodiment will be described with reference to FIGS. 3 to 5. FIG. 3 is a diagram illustrating an example of the planar structure of the light receiving pixel 11 according to the first embodiment of the disclosure, FIG. 4 is a cross-sectional view taken along line A-A illustrated in FIG. 3, and FIG. 5 is a cross-sectional view taken along line B-B illustrated in FIG. 3 as viewed in the direction of arrows. Note that FIGS. 3 to 5 are schematic diagrams and are not necessarily strictly illustrated.

Moreover, in the disclosure, the concentration of impurities is indicated by expressions such as "P+", "N−", "N+", or "N++". In a portion illustrated as "P+", for example, the concentration of a p-type impurity (acceptor) is in a range of $1 \times 10^{16}$ cm$^{-3}$ to $5 \times 10^{18}$ cm$^{-3}$.

Meanwhile, "N+" indicates that the concentration of an n-type impurity (donor) is higher than that of "N−", and "N++" indicates that the concentration of an n-type impurity (donor) is higher than that of "N+". In a portion described as "N−", for example, the concentration of an n-type impurity (donor) is in a range of $1 \times 10^{16}$ cm$^{-3}$ to $5 \times 10^{18}$ cm$^{-3}$.

As illustrated in FIG. 4 and others, the light receiving pixel 11 is formed on a semiconductor substrate 30. The semiconductor substrate 30 is, for example, a silicon substrate. The semiconductor substrate 30 has a p-well layer 32 on a surface of the semiconductor substrate 30 and in the vicinity thereof and an n-type semiconductor layer 31 at a place deeper than the p-well layer 32.

An internal gate PY is provided on the surface of the semiconductor substrate 30 and includes a gate electrode 41 and a gate insulating film 42. A gate of a transfer transistor TY is provided on the surface of the semiconductor substrate 30 and includes a gate electrode 43 and a gate insulating film 44.

An internal gate TX is provided on the surface of the semiconductor substrate 30 and includes a gate electrode 45 and a gate insulating film 46. A gate of a transfer transistor TRG is provided on the surface of the semiconductor substrate 30 and includes a gate electrode 47 and a gate insulating film 48. Note that, in the light receiving pixel 11 according to the first embodiment, light is incident from the back surface side of the semiconductor substrate 30.

The p-well layer 32 is a p-type semiconductor region formed on the surface of the semiconductor substrate 30 and in the vicinity thereof. In the p-well layer 32, an n-type semiconductor region 33 and a p-type semiconductor region 34 are formed at a position facing the internal gate PY.

The p-type semiconductor region 34 is formed on the surface of the semiconductor substrate 30 and is in contact with the n-type semiconductor region 33. The n-type semiconductor region 33 and the p-type semiconductor region 34 are stacked in a thickness direction (normal direction) of the semiconductor substrate 30 and constitute a photodiode PD.

As illustrated in FIG. 3, the photodiode PD is disposed at a position adjacent to a charge holding unit MEM in plan view. The internal gate PY is disposed inside the photodiode PD in plan view and is disposed adjacent to the transfer transistor TY. The transfer transistor TY is disposed between the photodiode PD and the charge holding unit MEM in plan view.

As illustrated in FIG. 4, the charge holding unit MEM is formed in a portion of the p-well layer 32 facing the gate of the transfer transistor TY and the internal gate TX.

The charge holding unit MEM is formed at a predetermined depth from the surface of the semiconductor substrate 30. The charge holding unit MEM is constituted by an n-type semiconductor region 35 formed in the p-well layer 32. A p-type semiconductor region 36 is formed between the surface of the semiconductor substrate 30 and the charge holding unit MEM (n-type semiconductor region 35).

As illustrated in FIG. 3, the transfer transistor TY is arranged in such a manner that a partial region overlaps a partial region of the charge holding unit MEM in plan view. The internal gate TX is disposed inside the charge holding unit MEM in plan view and is disposed between the transfer transistor TY and the transfer transistor TRG.

The floating diffusion FD, the discharge floating diffusion OFD, and the readout circuit 12 are formed around a region including the photodiode PD and the charge holding unit MEM in plan view.

As illustrated in FIG. 4, the floating diffusion FD is constituted by an n-type semiconductor region 37 formed in the p-well layer 32. As illustrated in FIG. 5, the discharge floating diffusion OFD is constituted by an n-type semiconductor region 38 formed in the p-well layer 32.

As illustrated in FIG. 3, the transfer transistor TRG is formed between the floating diffusion FD and the charge holding unit MEM in plan view. In addition, a discharge transistor OFG is formed between the discharge floating diffusion OFD and the photodiode PD in plan view. In addition, the internal gate PY is disposed at a position adjacent to the discharge transistor OFG in plan view.

[Details of Pixel Driving Processing]

Figure 6:
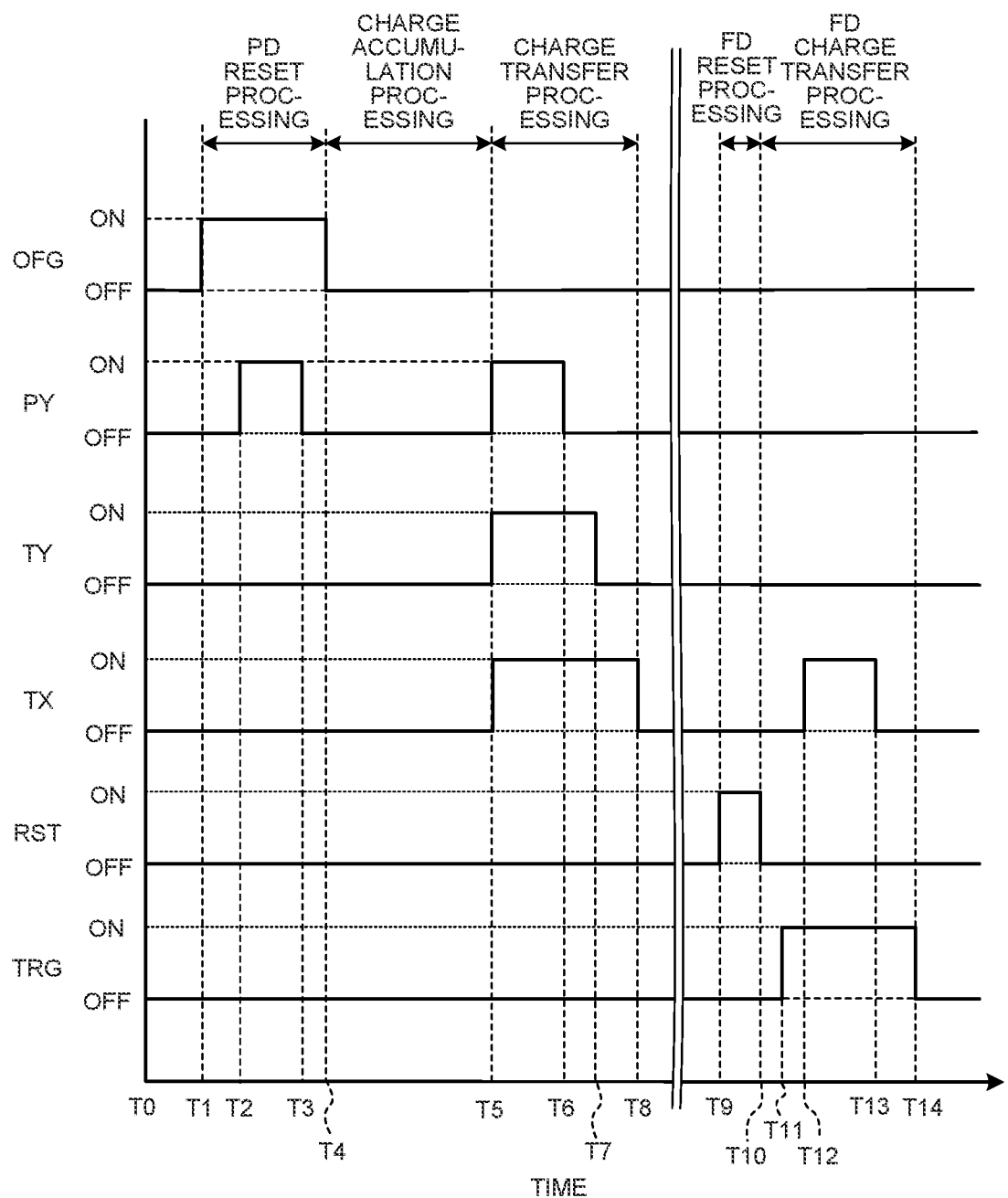
FIG. 6 is a timing chart illustrating operation of each unit in pixel driving processing according to the first embodiment of the disclosure.

Next, details of pixel driving processing according to the first embodiment will be described with reference to FIGS. 6, 7A, 7B, 7C, 7D, 7E, 7F, 7G, 7H, 7I, 7J, 7K 7L, 7M, and 7N. FIG. 6 is a timing chart illustrating operation of each unit in the pixel driving processing according to the first embodiment of the disclosure, and FIGS. 7A, 7B, 7C, 7D, 7E, 7F, 7G, 7H, 7I, 7J, 7K, 7L, 7M, and 7N are diagrams illustrating transition in a potential diagram in the light receiving pixel 11 according to the first embodiment of the disclosure.

Note that, in FIGS. 7A, 7B, 7C, 7D, and 7E described below, potential states of the photodiode PD, the discharge floating diffusion OFD, and a potential barrier PB3 positioned therebetween are illustrated.

Figure 7A:
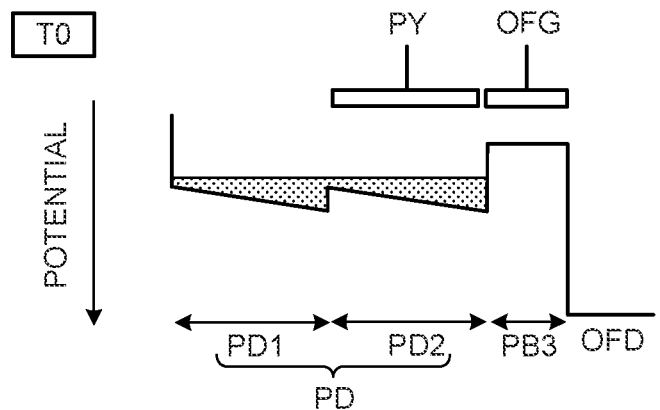
FIG. 7A is a diagram illustrating transition of a potential diagram in the light receiving pixel according to the first embodiment of the disclosure.

Incidentally, as illustrated in FIG. 7A and others, the photodiode PD has a first region PD1 not covered with the internal gate PY and a second region PD2 covered with the internal gate PY. The potential of the first region PD1 is designed to become gradually deeper as it approaches the second region PD2, and the potential of the second region PD2 is designed to become gradually deeper as it approaches the potential barrier PB3.

A shallow potential barrier is further included between the first region PD1 and the second region PD2. As a result, in the light receiving pixel 11 according to the first embodiment, the overall potential depth of the first region PD1 is designed to be substantially equal to the overall potential depth of the second region PD2.

In addition, the discharge transistor OFG is disposed between the second region PD2 of the photodiode PD and the discharge floating diffusion OFD (that is, the potential barrier PB3).

FIG. 7A is a potential diagram in the light receiving pixel 11 at time T0 in FIG. 6. Note that, in the following drawings, in order to facilitate understanding, in a case where a gate or a transistor is in an ON state, the gate or the transistor is illustrated in black, and in a case where the gate or the transistor is in an OFF state, the gate or the transistor is illustrated in white. That is, in FIG. 7A (time T0), both the internal gate PY and the discharge transistor OFG are in the OFF state.

At the time T0, charges are accumulated in the photodiode PD due to light incident on the photodiode PD. Note that, in the following drawings, charges accumulated in the light receiving pixel 11 are indicated by dotted hatching to facilitate understanding.

As illustrated in FIG. 6, the system control circuit 24 (see FIG. 1) performs PD reset processing from time T1. First, the system control circuit 24 changes the discharge transistor OFG from the OFF state to the ON state at the time T1.

Figure 7B:
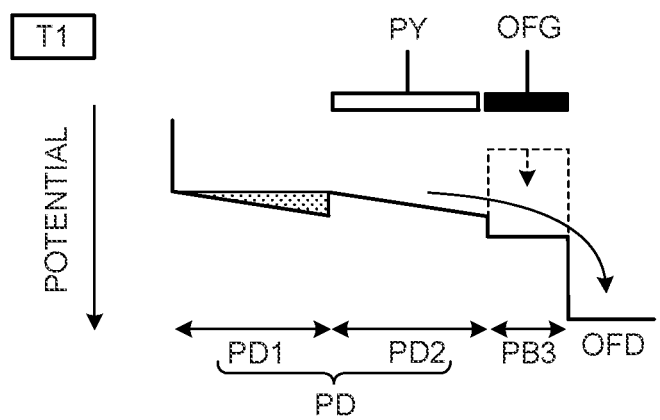
FIG. 7B is a diagram illustrating transition of the potential diagram in the light receiving pixel according to the first embodiment of the disclosure.

As a result, as illustrated in FIG. 7B, the potential of the potential barrier PB3 becomes deeper than the potential of the second region PD2 of the photodiode PD, and thus the charges accumulated in the second region PD2 are transferred (that is, discharged) to the discharge floating diffusion OFD.

Note that, in the first embodiment, since a shallow potential barrier exists between the first region PD1 and the second region PD2 of the photodiode PD, not all the charges in the first region PD1 are discharged at the time T1.

Next, as illustrated in FIG. 6, the system control circuit 24 changes the internal gate PY from the OFF state to the ON state at time T2 when a given period of time has elapsed from the time T1. Note that, at the time T2, the discharge transistor OFG is maintained in the ON state.

Figure 7C:
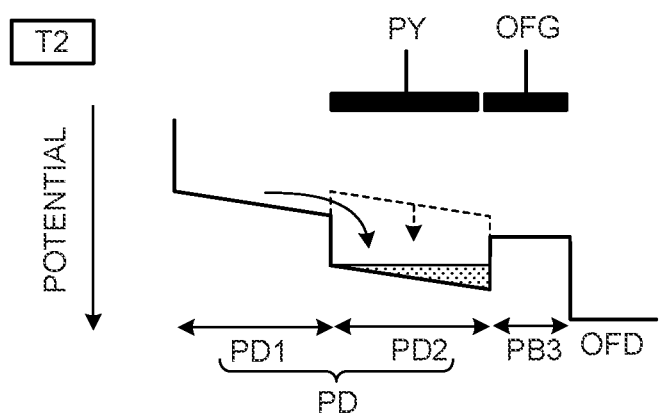
FIG. 7C is a diagram illustrating transition of the potential diagram in the light receiving pixel according to the first embodiment of the disclosure.

As a result, as illustrated in FIG. 7C, the potential of the second region PD2 becomes deeper than the potentials of the first region PD1 and the potential barrier PB3, and thus the charges accumulated in the first region PD1 are transferred to the second region PD2.

Next, as illustrated in FIG. 6, the system control circuit 24 changes the internal gate PY from the ON state to the OFF state at time T3 when a given period of time has elapsed from the time T2. Note that, at the time T3, the discharge transistor OFG is maintained in the ON state.

Figure 7D:
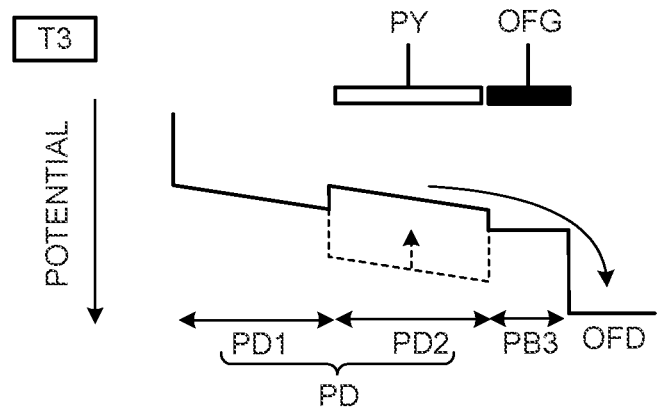
FIG. 7D is a diagram illustrating transition of the potential diagram in the light receiving pixel according to the first embodiment of the disclosure.

As a result, as illustrated in FIG. 7D, the potential of the second region PD2 becomes shallower than the potential of the potential barrier PB3, and thus the charges accumulated in the second region PD2 are transferred (that is, discharged) to the discharge floating diffusion OFD.

Figure 7E:
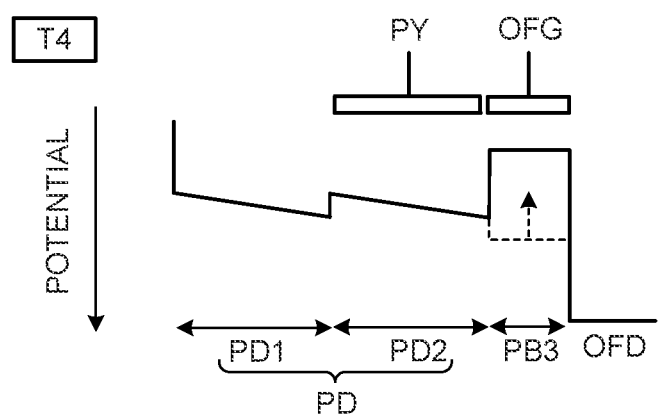
FIG. 7E is a diagram illustrating transition of the potential diagram in the light receiving pixel according to the first embodiment of the disclosure.

Next, as illustrated in FIG. 6, the system control circuit 24 changes the discharge transistor OFG from the ON state to the OFF state at time T4 when a given period of time has elapsed from the time T3. As a result, as illustrated in FIG. 7E, the potentials of the second region PD2 and the potential barrier PB3 return to preset depths.

By the processing described above, all the charges accumulated in the photodiode PD are discharged from the discharge floating diffusion OFD, the reset processing (PD reset processing) of the photodiode PD is completed, and exposure in the photodiode PD is started.

Note that, in parallel with the PD reset processing, the system control circuit 24 performs processing of resetting the charge holding unit MEM and the floating diffusion FD, however, description of such processing is omitted.

Next, as illustrated in FIG. 6, the system control circuit 24 performs charge accumulation processing (exposure processing) from the time T4 to time T5 when a given exposure time elapses.

Note that in FIGS. 7F, 7G, 7H, 7I, 7J, 7K, 7L, 7M, and 7N described below, the potential states of the photodiode PD (the first region PD1 and the second region PD2), the charge holding unit MEM, and the floating diffusion FD are illustrated.

Furthermore, in FIGS. 7F, 7G, 7H, 7I, 7J, 7K, 7L, 7M, and 7N, the potential state of the potential barrier PB1 located between the photodiode PD and the charge holding unit MEM is also illustrated. In FIGS. 7F, 7G, 7H, 7I, 7J, 7K, 7L, 7M, and 7N, the potential state of the potential barrier PB2 located between the charge holding unit MEM and the floating diffusion FD is also illustrated.

Figure 7F:
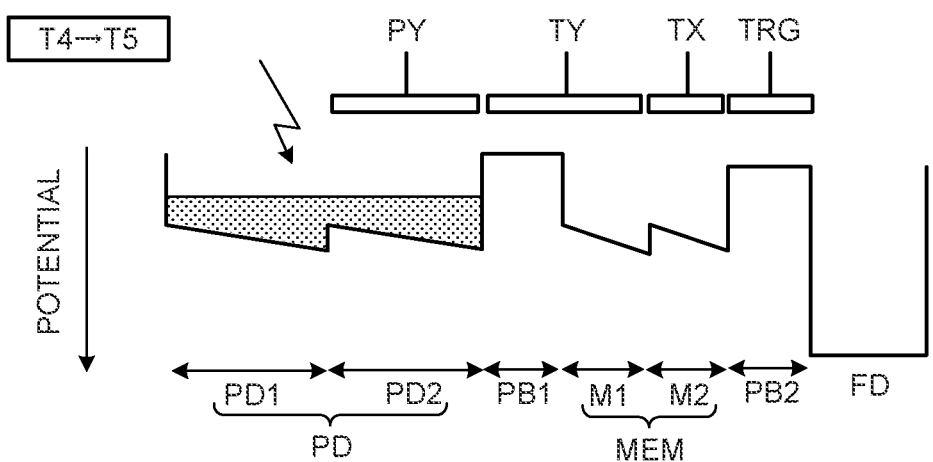
FIG. 7F is a diagram illustrating transition of the potential diagram in the light receiving pixel according to the first embodiment of the disclosure.

Furthermore, as illustrated in FIG. 7F and others, the charge holding unit MEM includes a first region M1 covered with the transfer transistor TY and a second region M2 covered with the internal gate TX. The potential of the first region M1 is designed to become gradually deeper as it approaches the second region M2, and the potential of the second region M2 is designed to become gradually deeper as it approaches the potential barrier PB2.

Furthermore, a shallow potential barrier is provided between the first region M1 and the second region M2. As a result, in the light receiving pixel 11 according to the first embodiment, the overall potential depth of the first region M1 is designed to be substantially equal to the overall potential depth of the second region M2.

Furthermore, the transfer transistor TRG is disposed between the second region M2 of the charge holding unit MEM and the floating diffusion FD (that is, the potential barrier PB2).

FIG. 7F is a potential diagram in the light receiving pixel 11 that is performing the charge accumulation processing. As illustrated in FIG. 7F, in the charge accumulation processing, the internal gates PY and TX and the transfer transistors TY and TRG are all in the OFF state.

As a result, the system control circuit 24 can cause the photodiode PD to accumulate charges generated by photoelectric conversion of light incident on the photodiode PD.

Next, as illustrated in FIG. 6, the system control circuit 24 changes the internal gates PY and TX and the transfer transistor TY from the OFF state to the ON state at the time T5 when a given exposure time has elapsed from the time T4. Note that, at the time T5, the transfer transistor TRG is maintained in the OFF state.

Figure 7G:
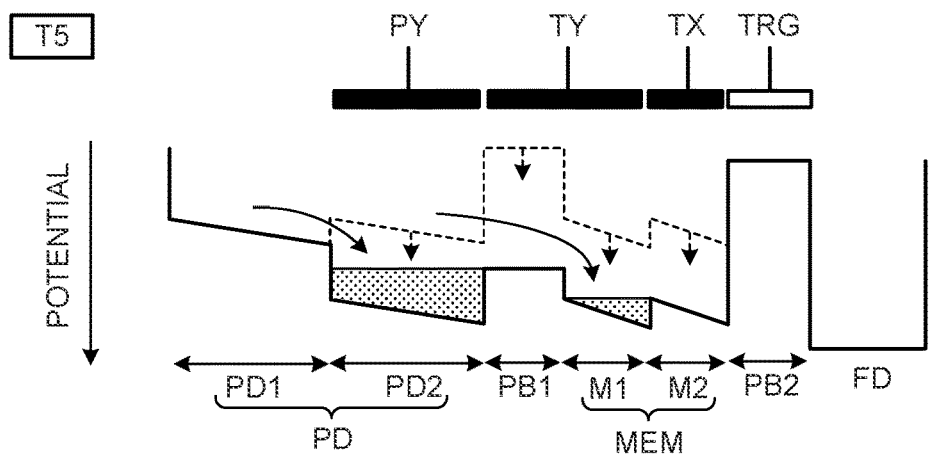
FIG. 7G is a diagram illustrating transition of the potential diagram in the light receiving pixel according to the first embodiment of the disclosure.

As a result, as illustrated in FIG. 7G, the potentials of the second region PD2 and the first region M1 become deeper than the potentials of the first region PD1 and the potential barrier PB1, and thus the charges accumulated in the photodiode PD are transferred to the second region PD2 and the first region M1.

Next, as illustrated in FIG. 6, the system control circuit 24 changes the internal gate PY from the ON state to the OFF state at time T6 when a given period of time has elapsed from the time T5. Note that, at the time T6, the transfer transistor TY and the internal gate TX are maintained in the ON state, and the transfer transistor TRG is maintained in the OFF state.

Figure 7H:
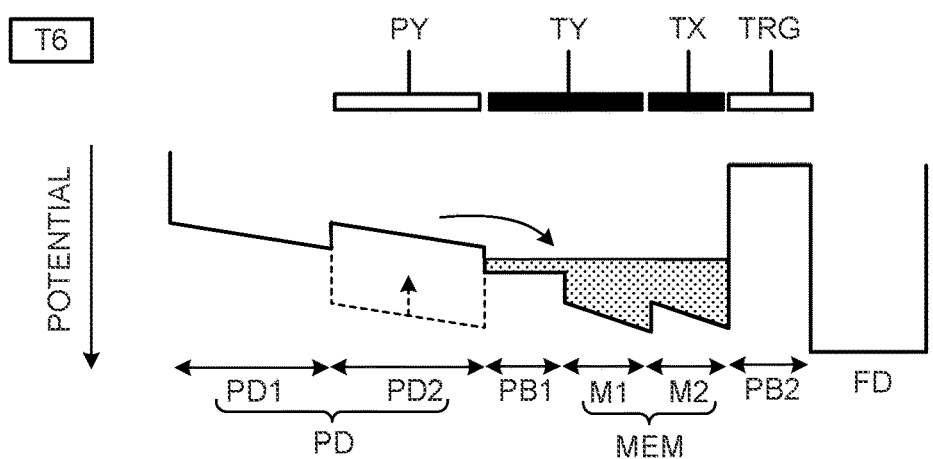
FIG. 7H is a diagram illustrating transition of the potential diagram in the light receiving pixel according to the first embodiment of the disclosure.

As a result, as illustrated in FIG. 7H, the potential of the second region PD2 becomes shallower than the potential of the potential barrier PB1, and thus the charges accumulated in the second region PD2 are transferred to the potential barrier PB1 and the charge holding unit MEM.

Next, as illustrated in FIG. 6, the system control circuit 24 changes the transfer transistor TY from the ON state to the OFF state at time T7 when a given period of time has elapsed from the time T6. Note that, at the time T7, the internal gate TX is maintained in the ON state, and the internal gate PY and the transfer transistor TRG are maintained in the OFF state.

Figure 7I:
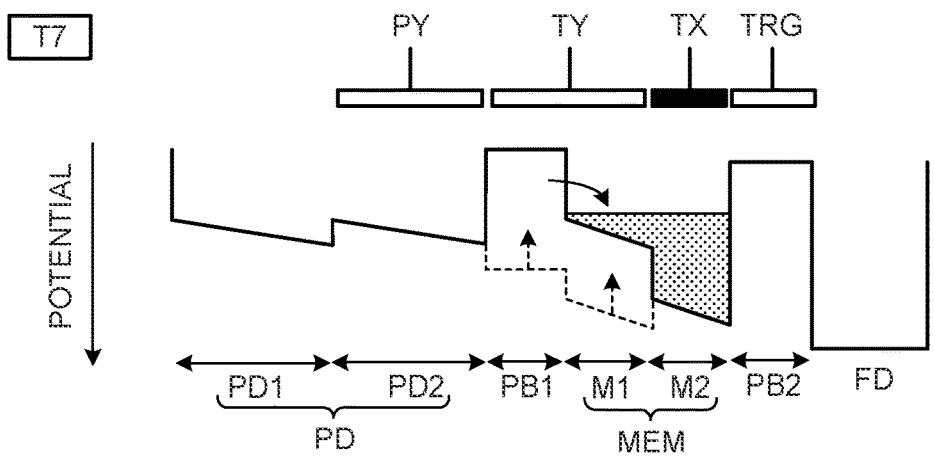
FIG. 7I is a diagram illustrating transition of the potential diagram in the light receiving pixel according to the first embodiment of the disclosure.

As a result, as illustrated in FIG. 7I, the potential of the potential barrier PB1 becomes shallower than the potential of the charge holding unit MEM, and thus the charges accumulated in the potential barrier PB1 are transferred to the charge holding unit MEM.

Figure 7J:
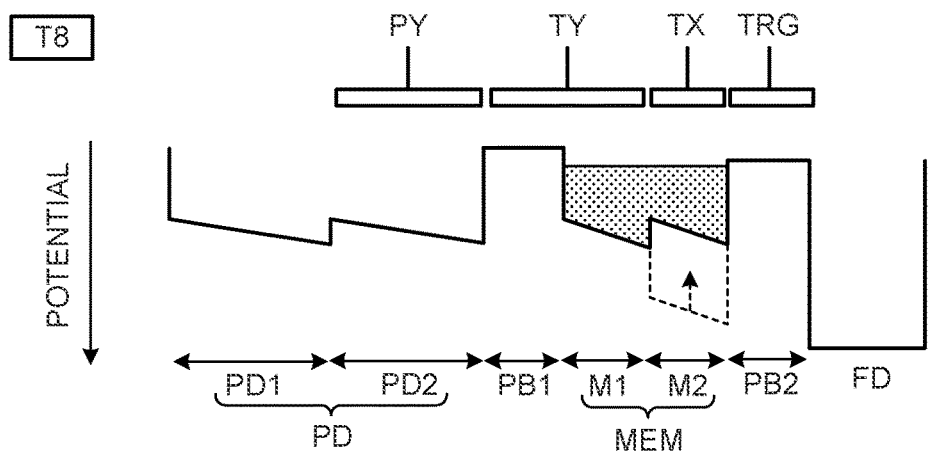
FIG. 7J is a diagram illustrating transition of the potential diagram in the light receiving pixel according to the first embodiment of the disclosure.

Next, as illustrated in FIG. 6, the system control circuit 24 changes the internal gate TX from the ON state to the OFF state at time T8 when a given period of time has elapsed from the time T7. As a result, as illustrated in FIG. 7J, the potential of the second region M2 returns to a preset depth.

With the processing described above, all the charges accumulated in the photodiode PD are transferred to the charge holding unit MEM, and charge transfer processing from the photodiode PD to the charge holding unit MEM is completed.

Next, as illustrated in FIG. 6, the system control circuit 24 performs FD reset processing of resetting the floating diffusion FD from time T9 after time T8 when the charge transfer processing has been completed.

First, the system control circuit 24 changes the reset transistor RST from the OFF state to the ON state at the time T9. As a result, the charges accumulated in the floating diffusion FD are discharged to the outside.

Then, the system control circuit 24 changes the reset transistor RST from the ON state to the OFF state at time T10 when a given period of time has elapsed from the time T9. As a result, the FD reset processing is completed.

Next, the system control circuit 24 performs FD charge transfer processing of transferring charges to the floating diffusion FD from time T10 when the FD reset processing has been completed.

First, the system control circuit 24 changes the transfer transistor TRG from the OFF state to the ON state at time T11 when a given period of time has elapsed from the time T10. Note that, at the time T11, the internal gates PY and TX and the transfer transistor TY are maintained in the OFF state.

Figure 7K:
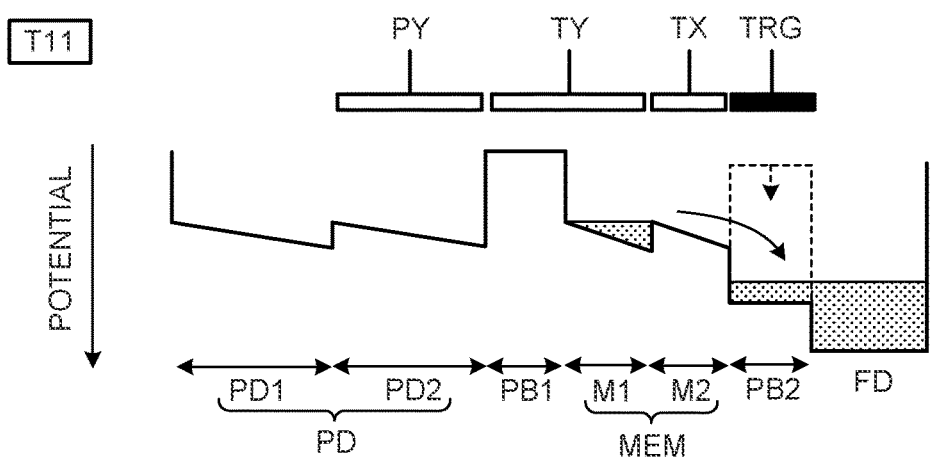
FIG. 7K is a diagram illustrating transition of the potential diagram in the light receiving pixel according to the first embodiment of the disclosure.

As a result, as illustrated in FIG. 7K, the potential of the potential barrier PB2 becomes deeper than the potential of the second region M2, and thus the charges accumulated in the second region M2 are transferred to the floating diffusion FD.

Note that, in the first embodiment, since there is a shallow potential barrier between the first region M1 and the second region M2 of the charge holding unit MEM, not all the charges in the first region M1 are transferred at the time T11.

Next, as illustrated in FIG. 6, the system control circuit 24 changes the internal gate TX from the OFF state to the ON state at time T12 when a given period of time has elapsed from the time T11. Note that, at the time T12, the internal gate PY and the transfer transistor TY are maintained in the OFF state, and the transfer transistor TRG is maintained in the ON state.

Figure 7L:
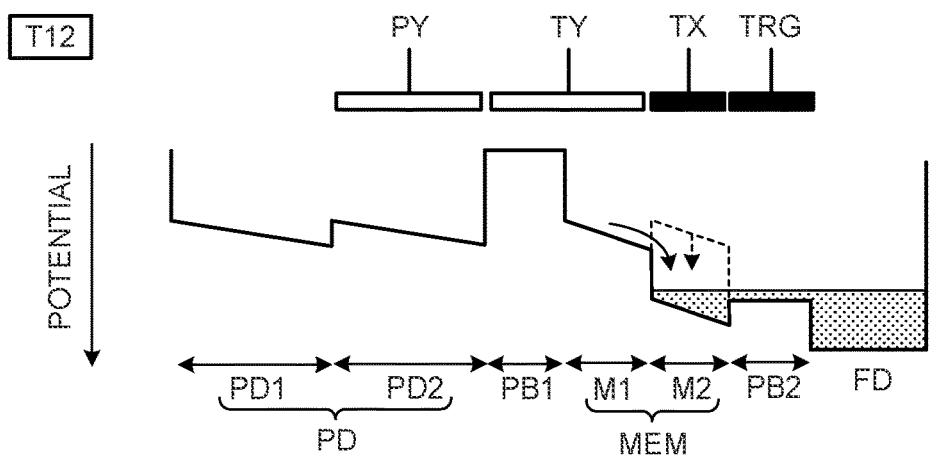
FIG. 7L is a diagram illustrating transition of the potential diagram in the light receiving pixel according to the first embodiment of the disclosure.

As a result, as illustrated in FIG. 7L, the potential of the second region M2 becomes deeper than the potential of the first region M1, and thus the charges accumulated in the first region M1 are transferred to the second region M2.

Next, as illustrated in FIG. 6, the system control circuit 24 changes the internal gate TX from the ON state to the OFF state at time T13 when a given period of time has elapsed from the time T12. Note that, at the time T13, the internal gate PY and the transfer transistor TY are maintained in the OFF state, and the transfer transistor TRG is maintained in the ON state.

Figure 7M:
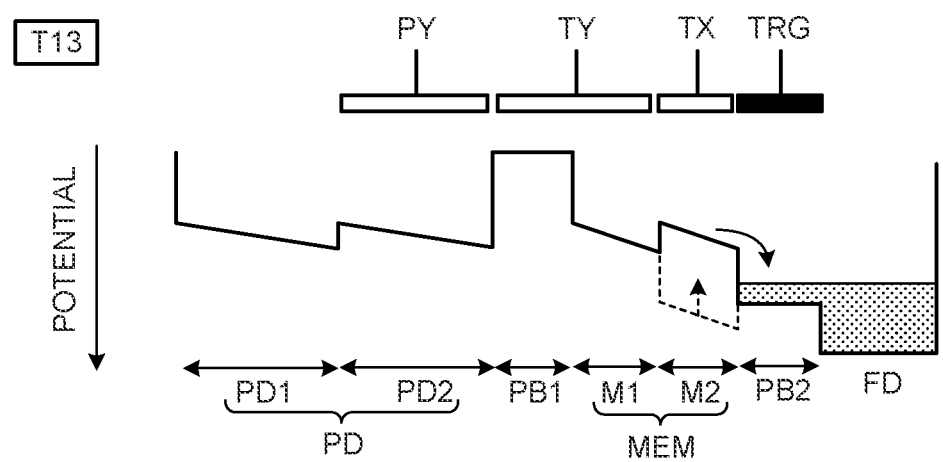
FIG. 7M is a diagram illustrating transition of the potential diagram in the light receiving pixel according to the first embodiment of the disclosure.

As a result, as illustrated in FIG. 7M, the potential of the second region M2 becomes shallower than the potential of the potential barrier PB2, and thus the charges accumulated in the second region M2 are transferred to the potential barrier PB2.

Figure 7N:
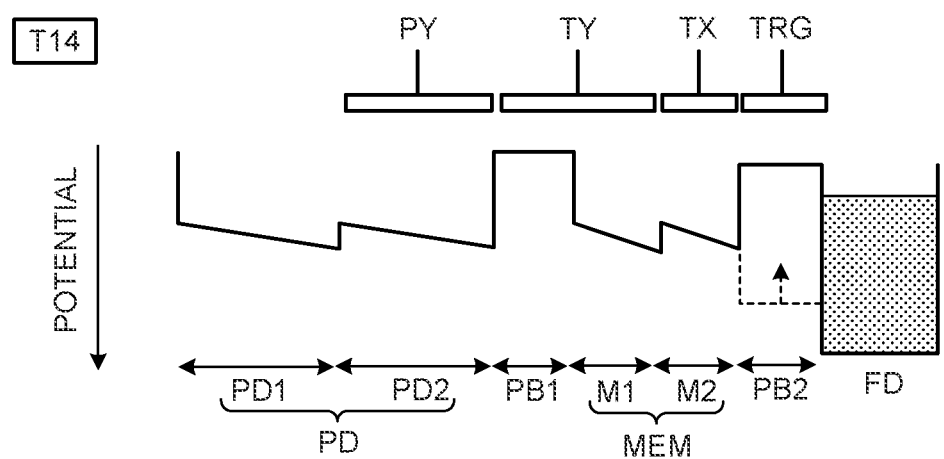
FIG. 7N is a diagram illustrating transition of the potential diagram in the light receiving pixel according to the first embodiment of the disclosure.

Next, as illustrated in FIG. 6, the system control circuit 24 changes the transfer transistor TRG from the ON state to the OFF state at time T14 when a given period of time has elapsed from the time T13. As a result, as illustrated in FIG. 7N, the charges accumulated in the potential barrier PB2 are transferred to the floating diffusion FD, and the potential of the potential barrier PB2 returns to a preset depth.

With the processing described above, all the charges accumulated in the charge holding unit MEM are transferred to the floating diffusion FD, and charge transfer processing (FD charge transfer processing) from the charge holding unit MEM to the floating diffusion FD is completed.

Note that, in the FD charge transfer processing described above, the system control circuit 24 changes the selection transistor SEL (see FIG. 2) to the ON state. As a result, a pixel signal at a signal level corresponding to the potential of the floating diffusion FD is generated in the amplification transistor AMP (see FIG. 2), and the generated pixel signal is output to the vertical signal line VSL (see FIG. 2) via the selection transistor SEL.

It is also preferable that the system control circuit 24 performs this read operation for each row of a predetermined unit number of pixels. As a result, the system control circuit 24 can perform imaging processing in a global shutter (GS) mode.

Here, as a method of improving the saturation charge amount of the photodiode PD, it is conceivable to design the potential of the photodiode PD, particularly, the potential of the first region PD1 to be rather deep on the upstream side.

On the other hand, if the potential of the first region PD1 is designed to be rather deep, a recess of potential is formed between the first region PD1 and the potential barrier PB1. As a result, when the charges accumulated in the photodiode PD are transferred to the charge holding unit MEM, charges remain in the recess of the potential, and thus it becomes difficult to transfer all the accumulated charges to the charge holding unit MEM.

Meanwhile, in the first embodiment described above, the internal gate PY that deepens the potential of the second region PD2 on the downstream side in the photodiode PD is included. As a result, even in a case where the potential of the first region PD1 is designed to be rather deep (for example, substantially equal to the second region PD2) as described above, all the charges accumulated in the photodiode PD can be transferred to the charge holding unit MEM.

That is, in the first embodiment, the potential of the first region PD1 of the photodiode PD can be designed to be rather deep. Therefore, according to the first embodiment, the saturation charge amount of the photodiode PD can be enhanced.

Furthermore, in the first embodiment, as illustrated in FIG. 3, the internal gate PY is preferably disposed at a position adjacent to the transfer transistor TY in plan view.

As a result, as illustrated in FIGS. 7F, 7G, 7H, 7I, and 7J and others, the system control circuit 24 can smoothly transfer the charges accumulated in the photodiode PD to the charge holding unit MEM via the second region PD2 and the potential barrier PB1.

In addition, in the first embodiment, the internal gate PY is preferably disposed at a position adjacent to the discharge transistor OFG in plan view.

As a result, as illustrated in FIGS. 7A, 7B, 7C, 7D, and 7E, the system control circuit 24 can smoothly discharge the charge remaining in the photodiode PD from the discharge floating diffusion OFD via the second region PD2 and the potential barrier PB3.

Furthermore, in the first embodiment, the transfer transistor TY is preferably disposed in such a manner as to cover not only a region between the photodiode PD and the charge holding unit MEM but also a partial region (first region M1) of the charge holding unit MEM in plan view.

As a result, as illustrated in FIGS. 7F, 7G, 7H, 7I, and 7J and others, the system control circuit 24 can smoothly transfer the charges accumulated in the photodiode PD to the charge holding unit MEM via the second region PD2 and the potential barrier PB1.

Furthermore, in the first embodiment, the internal gate TX is preferably disposed between the transfer transistor TY and the transfer transistor TRG inside the charge holding unit MEM in plan view.

As a result, as illustrated in FIGS. 7K, 7L, 7M, and 7N, the system control circuit 24 can smoothly transfer the charges accumulated in the charge holding unit MEM to the floating diffusion FD via the second region M2 and the potential barrier PB2.

[Various Modifications]

<First Modification>

Figure 8:
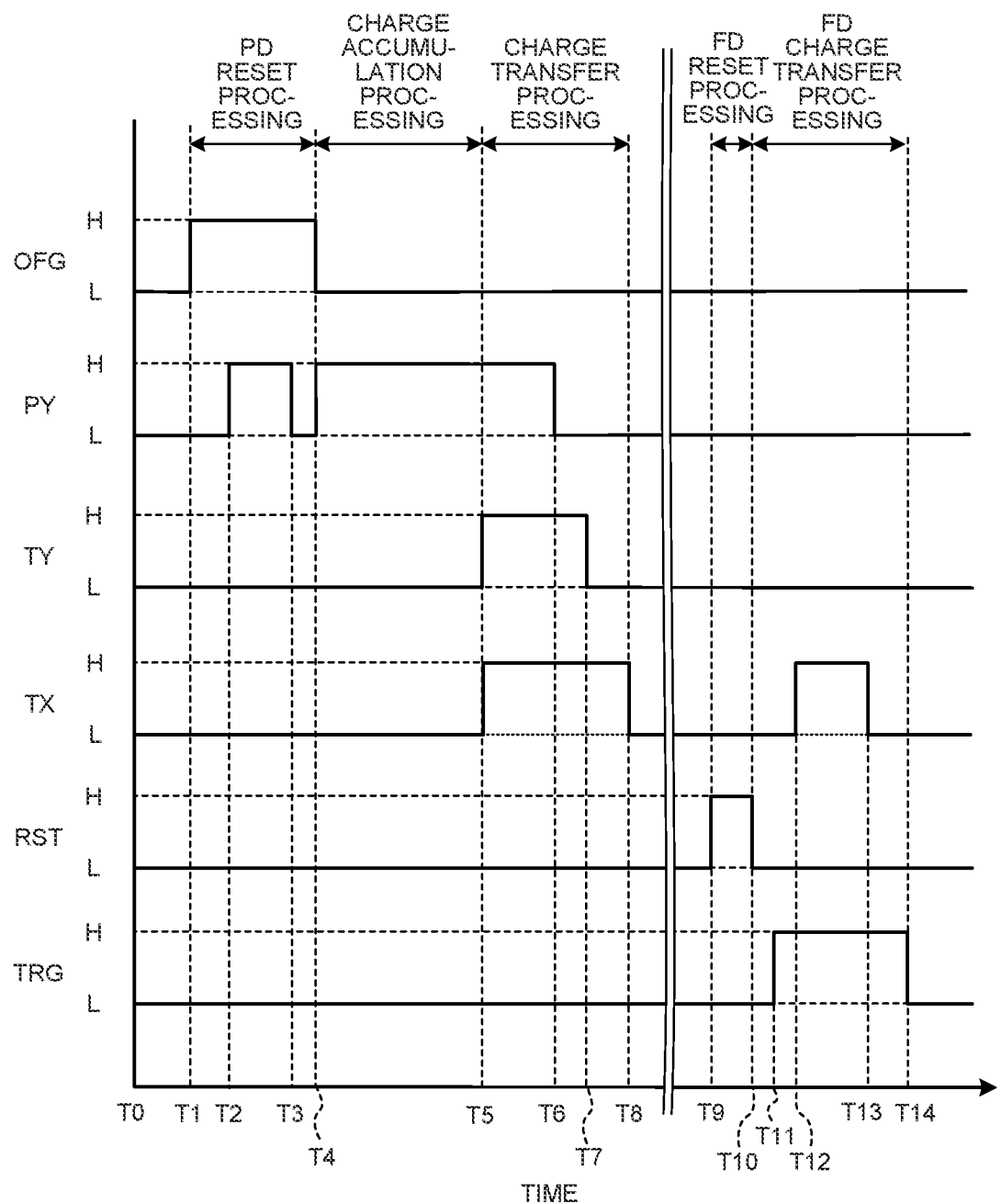
FIG. 8 is a timing chart illustrating operation of each unit in pixel driving processing according to a first modification of the first embodiment of the disclosure.

Next, various modifications of the first embodiment will be described with reference to FIGS. 8, 9A, 9B, 10, 11, 12, 13, 14, 15A, 15B, 15C, 15D, 15E, 15F 15G, 15H, 15I, 15J, 15K, 15L, and 16. FIG. 8 is a timing chart illustrating the operation of each unit in pixel driving processing according to a first modification of the first embodiment of the disclosure, and FIGS. 9A and 9B are diagrams illustrating the transition of a potential diagram in a light receiving pixel 11 according to a first modification of the first embodiment of the disclosure.

In the first modification, the operation in charge accumulation processing is different from that of the embodiment. Therefore, description of processing other than the charge accumulation processing will be omitted.

In the charge accumulation processing of the first modification, the system control circuit 24 (see FIG. 1) changes the internal gate PY from an OFF state to an ON state from time T4 as illustrated in FIG. 8. Note that, in the charge accumulation processing of the first modification, the internal gate TX and the transfer transistors TY and TRG are in the OFF state.

Figure 9A:
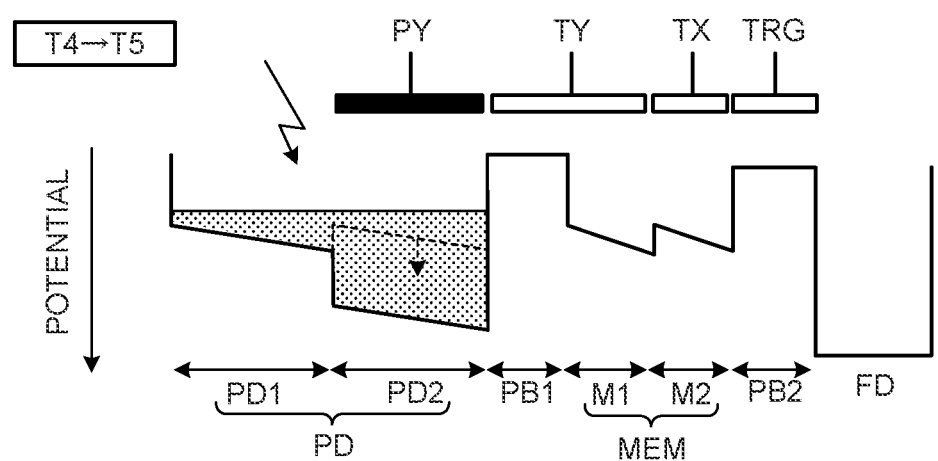
FIG. 9A is a diagram illustrating transition of a potential diagram in a light receiving pixel according to the first modification of the first embodiment of the disclosure.
Figure 9B:
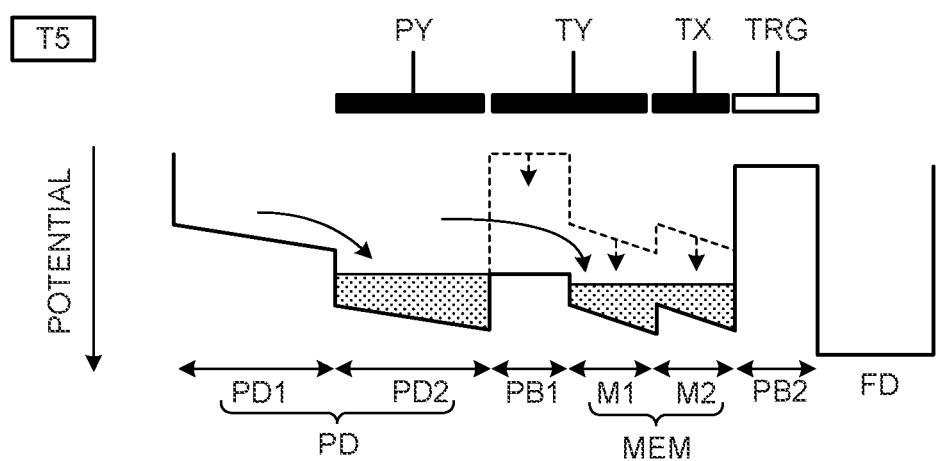
FIG. 9B is a diagram illustrating transition of a potential diagram in the light receiving pixel according to the first modification of the first embodiment of the disclosure.

As a result, as illustrated in FIG. 9A, the system control circuit 24 can accumulate charges generated by photoelectric conversion of light incident on the photodiode PD in the photodiode PD in which the potential of the second region PD2 is deep.

Next, as illustrated in FIG. 8, the system control circuit 24 changes the internal gate TX and the transfer transistor TY from the OFF state to the ON state at the time T5 when a given exposure time has elapsed from the time T4. Note that, at the time T5, the internal gate PY is maintained in the ON state.

As a result, as illustrated in FIG. 9B, the potentials of the second region PD2 and the charge holding unit MEM become deeper than the potentials of the first region PD1 and the potential barrier PB1. Therefore, in the first modification, the charges accumulated in the photodiode PD is transferred to the second region PD2 and the charge holding unit MEM.

As described above, in the charge accumulation processing according to the first modification, the internal gate PY is maintained in the ON state. As a result, the potential of the second region PD2 can be made deep at the time of the charge accumulation processing, and thus more charges can be accumulated in the photodiode PD.

Therefore, according to the first modification, the saturation charge amount of the photodiode PD can be further enhanced.

<Second Modification>

Figure 10:
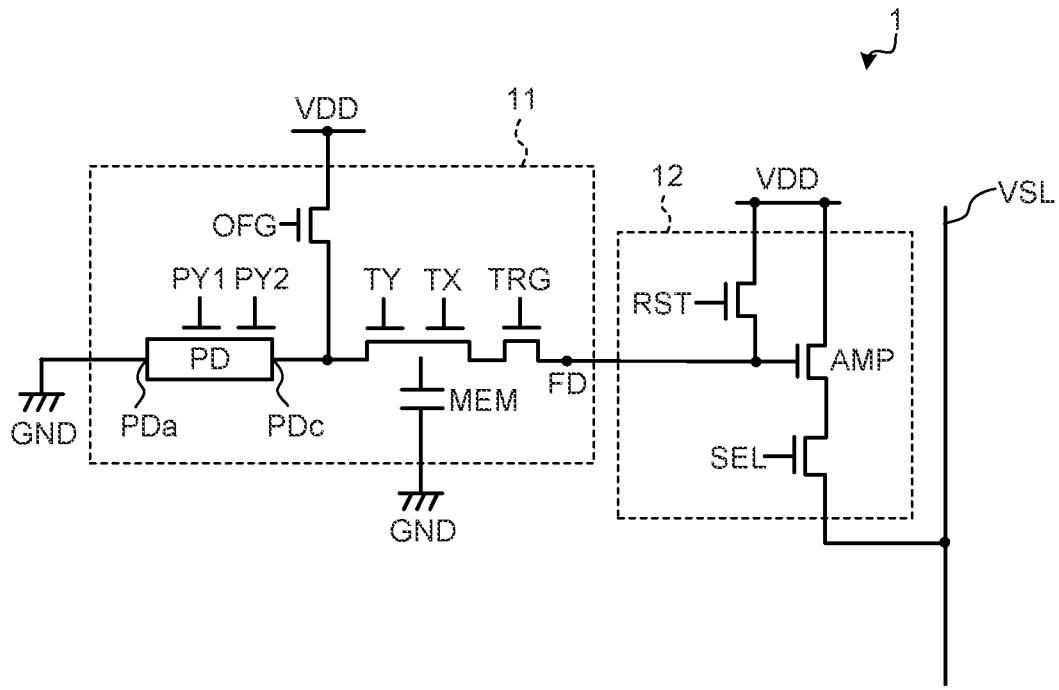
FIG. 10 is a diagram illustrating an example of a circuit configuration of a light receiving pixel 11 and a readout circuit 12 according to a second modification of the first embodiment of the disclosure.

Next, a circuit configuration of a light receiving pixel 11 according to a second modification of the first embodiment will be described with reference to FIG. 10. FIG. 10 is a diagram illustrating an example of a circuit configuration of a light receiving pixel 11 and a readout circuit 12 according to the second modification of the first embodiment of the disclosure. Note that, in the example of FIG. 10, a case where one light receiving pixel 11 is allocated to one readout circuit 12 is illustrated.

In the second modification, the configuration of an internal gate PY is different from that of the embodiment. Therefore, description of configurations other than that of the internal gate PY will be omitted.

As illustrated in FIG. 10, the light receiving pixel 11 according to the second modification includes a photodiode PD, transfer transistors TY and TRG, a charge holding unit MEM, a floating diffusion FD, a discharge transistor OFG, and internal gates PY1, PY2, and TX.

The internal gates PY1 and PY2 control the potential of a partial region in the photodiode PD in response to a control signal applied to the gate. Specifically, in a case where the internal gate PY2 is turned on, the internal gate PY2 deepens the potential of the region adjacent to the transfer transistor TY inside the photodiode PD.

In a case where the internal gate PY1 is turned on, the internal gate PY1 deepens the potential of a region adjacent to the internal gate PY2 inside the photodiode PD.

Figure 11:
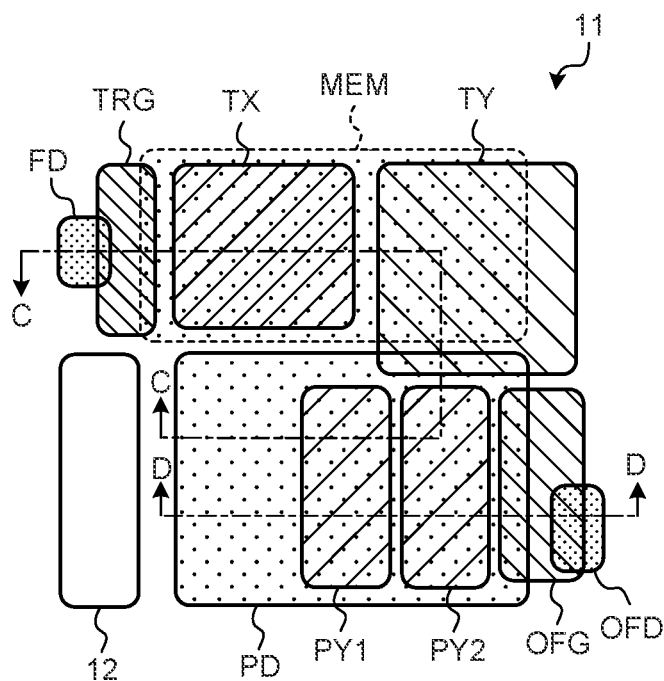
FIG. 11 is a diagram illustrating an example of a planar structure of a light receiving pixel according to the second modification of the first embodiment of the disclosure.
Figure 12:
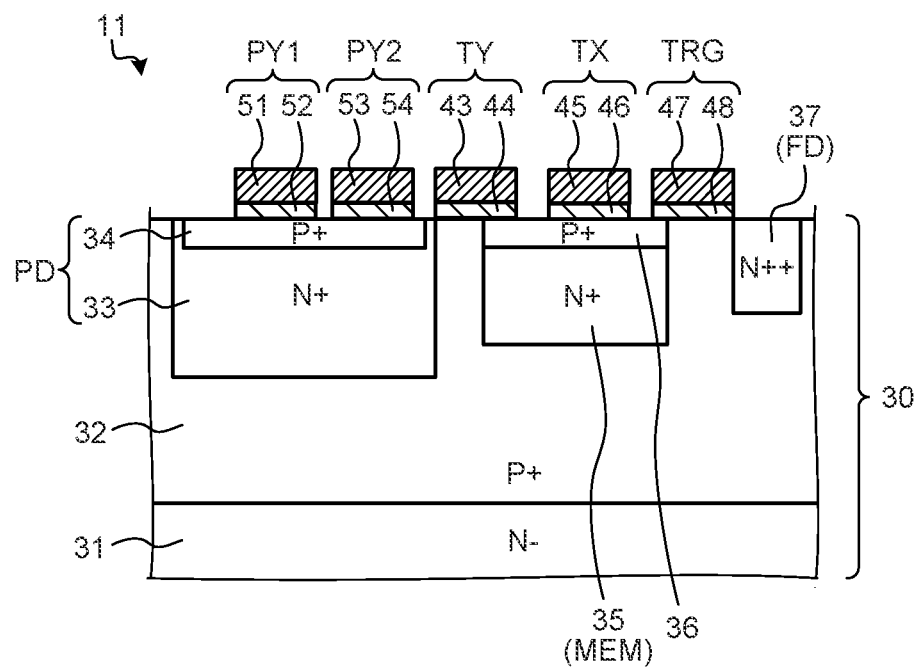
FIG. 12 is a cross-sectional view taken along line C-C illustrated in FIG. 11 as viewed in the direction of arrows.
Figure 13:
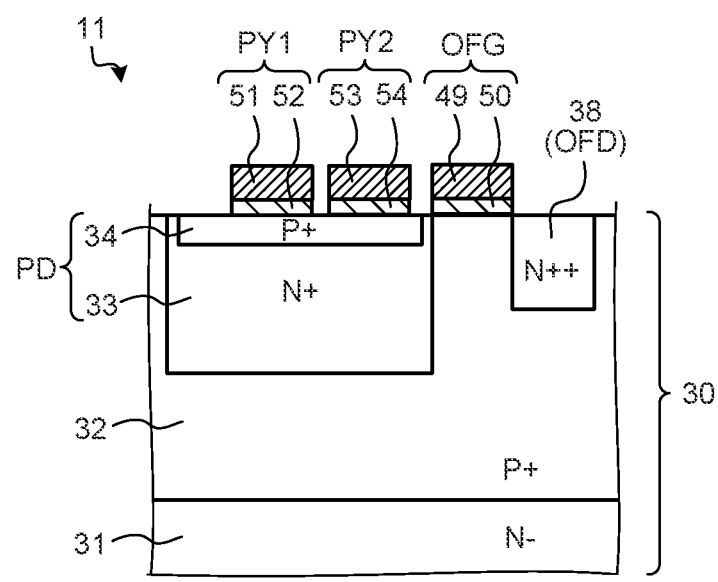
FIG. 13 is a cross-sectional view taken along line D-D illustrated in FIG. 11 as viewed in the direction of arrows.

Next, a planar structure and a cross-sectional structure of a light receiving pixel 11 according to the second modification will be described with reference to FIGS. 11 to 13. FIG. 11 is a diagram illustrating an example of the planar structure of the light receiving pixel 11 according to the second modification of the first embodiment of the disclosure, FIG. 12 is a cross-sectional view taken along line C-C illustrated in FIG. 11 as viewed in the direction of arrows, and FIG. 13 is a cross-sectional view taken along line D-D illustrated in FIG. 11 as viewed in the direction of arrows. Note that FIGS. 11 to 13 are schematic diagrams and are not necessarily strictly illustrated.

As illustrated in FIG. 12 and others, the internal gate PY1 is provided on a surface of a semiconductor substrate and includes a gate electrode 51 and a gate insulating film 52. The internal gate PY2 is provided on the surface of the semiconductor substrate 30 and includes a gate electrode 53 and a gate insulating film 54.

As illustrated in FIG. 11, the photodiode PD is disposed at a position adjacent to the charge holding unit MEM in plan view. The internal gate PY2 is disposed inside the photodiode PD in plan view and is disposed adjacent to the transfer transistor TY.

The internal gate PY1 is disposed inside the photodiode PD in plan view and is disposed adjacent to the internal gate PY2. The transfer transistor TY is disposed between the photodiode PD and the charge holding unit MEM in plan view.

A discharge transistor OFG is formed between the discharge floating diffusion OFD and the photodiode PD in plan view. In addition, the internal gate PY2 is disposed at a position adjacent to the discharge transistor OFG in plan view.

Figure 14:
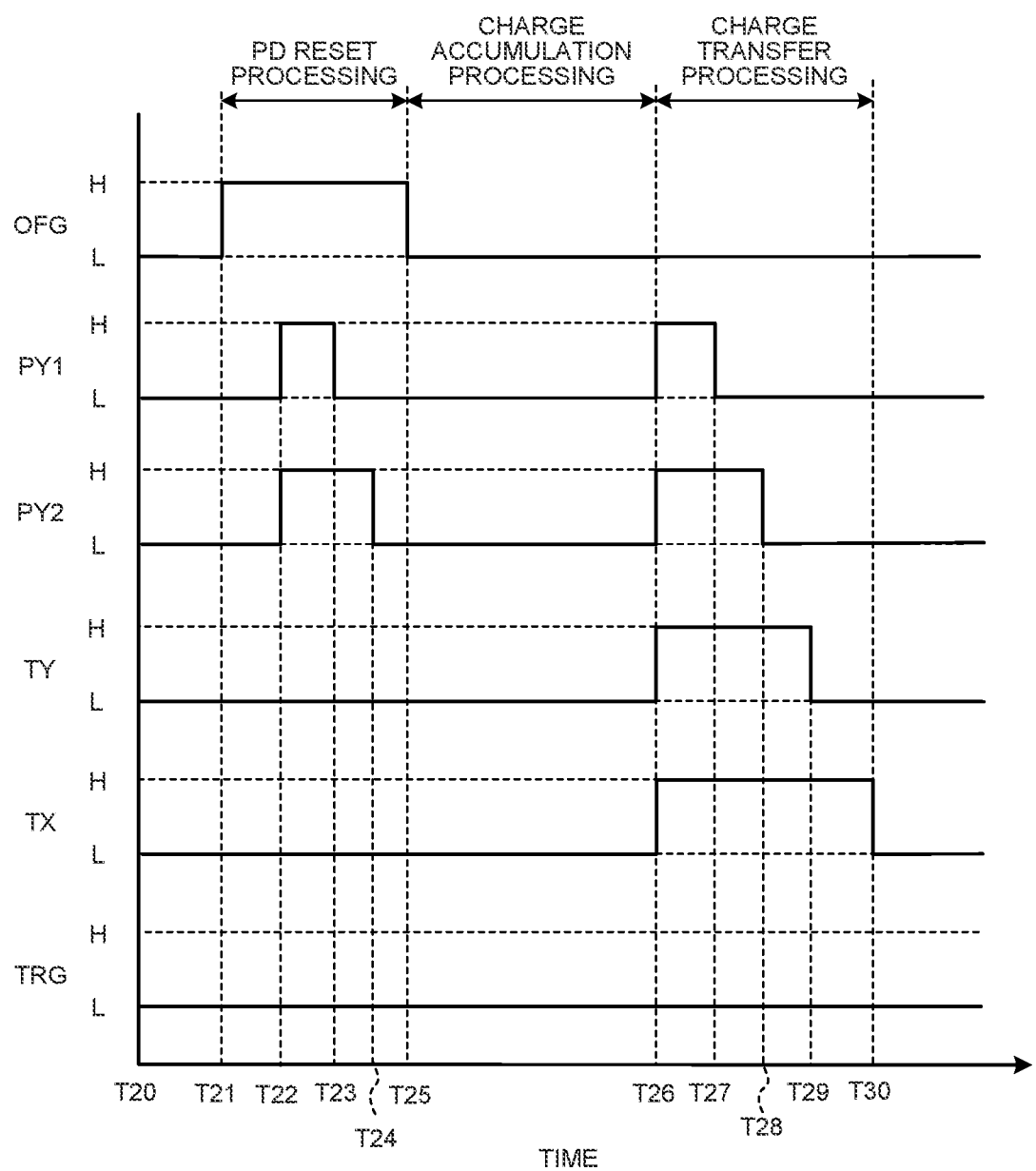
FIG. 14 is a timing chart illustrating operation of each unit in pixel driving processing according to a second modification of the first embodiment of the disclosure.

Next, details of pixel driving processing according to the second modification will be described with reference to FIGS. 14, 15A, 15B, 15C, 15D. 15E, 15F, 15G, 15H, 15I, 15J, 15K, and 15L. FIG. 14 is a timing chart illustrating the operation of each unit in the pixel driving processing according to the second modification of the first embodiment of the disclosure, and FIGS. 15A and 15L are diagrams illustrating the transition of a potential diagram in a light receiving pixel 11 according to the second modification of the first embodiment of the disclosure.

Note that, in FIGS. 15A, 15B, 15C, 15D, 15E, and 15F described below, potential states of the photodiode PD, the discharge floating diffusion OFD, and a potential barrier PB3 positioned therebetween are illustrated.

Figure 15A:
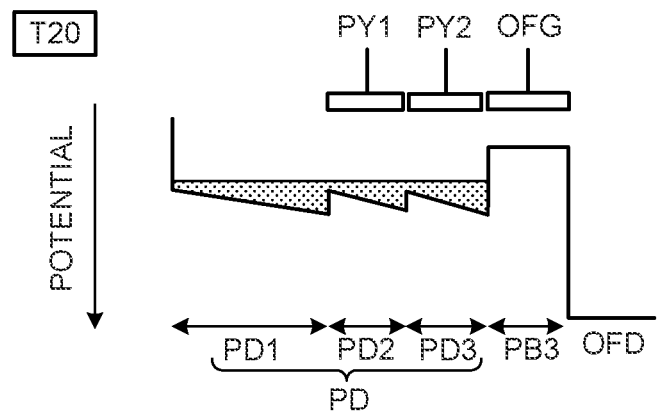
FIG. 15A is a diagram illustrating transition of a potential diagram in a light receiving pixel according to the second modification of the first embodiment of the disclosure.

Incidentally, as illustrated in FIG. 15A and others, the photodiode PD has a first region PD1 not covered with the internal gates PY1 and PY2, a second region PD2 covered with the internal gate PY1, and a third region PD3 covered with the internal gate PY2.

The potential of the first region PD1 is designed to become gradually deeper as it approaches the second region PD2, and the potential of the second region PD2 is designed to become gradually deeper as it approaches the third region PD3. In addition, the potential of the third region PD3 is designed to become gradually deeper as it approaches the potential barrier PB3.

Furthermore, a shallow potential barrier is provided between the first region PD1 and the second region PD2 and between the second region PD2 and the third region PD3. As a result, in the light receiving pixel 11 according to the second modification, the overall potential depth of the first region PD1 is designed to be substantially equal to the overall potential depths of the second region PD2 and the third region PD3.

In addition, the discharge transistor OFG is disposed between the third region PD3 of the photodiode PD and the discharge floating diffusion OFD (that is, the potential barrier PB3).

FIG. 15A is a potential diagram in the light receiving pixel 11 at time T20 in FIG. 14. In FIG. 15A (time T20), the internal gates PY1 and PY2 and the discharge transistor OFG are all in an OFF state. In addition, at the time point of time T20, charges are accumulated in the photodiode PD due to light incident on the photodiode PD.

As illustrated in FIG. 14, the system control circuit 24 (see FIG. 1) performs PD reset processing from time T21. First, the system control circuit 24 changes the discharge transistor OFG from the OFF state to the ON state at time T21. Note that, at the time T21, the internal gates PY1 and PY2 are maintained in the OFF state.

Figure 15B:
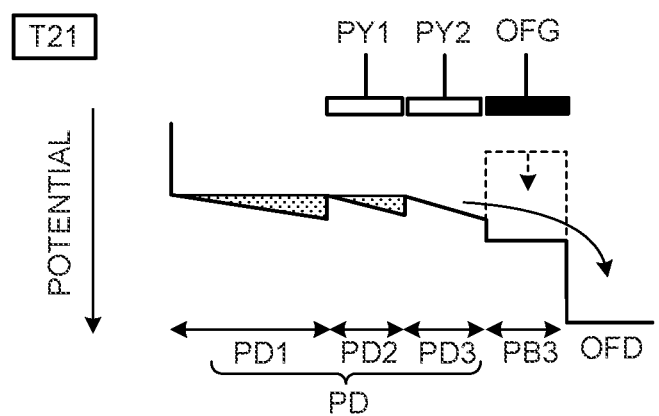
FIG. 15B is a diagram illustrating transition of a potential diagram in the light receiving pixel according to the second modification of the first embodiment of the disclosure.

As a result, as illustrated in FIG. 15B, the potential of the potential barrier PB3 becomes deeper than the potential of the third region PD3 of the photodiode PD, and thus the charges accumulated in the third region PD3 are transferred (that is, discharged) to the discharge floating diffusion OFD. Note that, in the second modification, there is a shallow potential barrier between the second region PD2 and the third region PD3 of the photodiode PD, not all the charges in the first region PD1 and the second region PD2 are discharged at the time T21.

Next, as illustrated in FIG. 14, the system control circuit 24 changes the internal gates PY1 and PY2 from the OFF state to the ON state at time T22 when a given period of time has elapsed from the time T21. Note that, at the time T22, the discharge transistor OFG is maintained in the ON state.

Figure 15C:
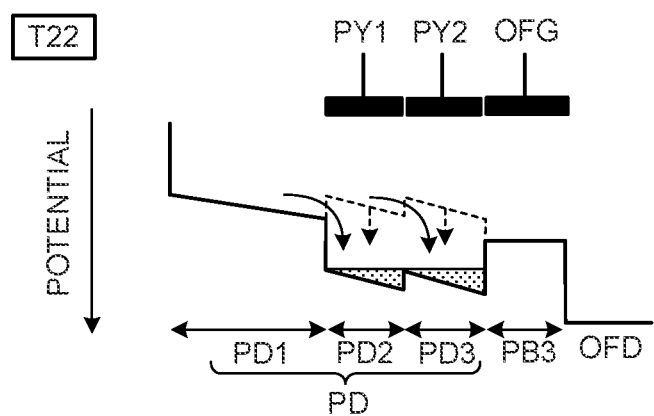
FIG. 15C is a diagram illustrating transition of a potential diagram in the light receiving pixel according to the second modification of the first embodiment of the disclosure.

As a result, as illustrated in FIG. 15C, the potentials of the second region PD2 and the third region PD3 become deeper than the potentials of the first region PD1 and the potential barrier PB3, and thus the charges accumulated in the first region PD1 are transferred to the second region PD2 and the third region PD3.

Next, as illustrated in FIG. 14, the system control circuit 24 changes the internal gate PY1 from the ON state to the OFF state at time T23 when a given period of time has elapsed from the time T22. Note that, at the time T23, the internal gate PY2 and the discharge transistor OFG are maintained in the ON state.

Figure 15D:
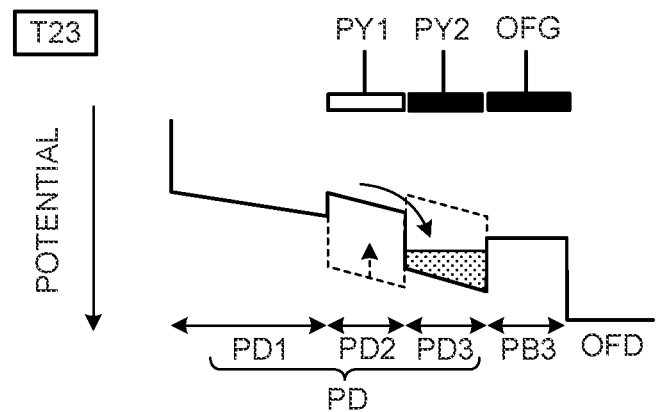
FIG. 15D is a diagram illustrating transition of a potential diagram in the light receiving pixel according to the second modification of the first embodiment of the disclosure.

As a result, as illustrated in FIG. 15D, the potential of the second region PD2 becomes shallower than the potential of the third region PD3, the charges accumulated in the second region PD2 are transferred to the third region PD3.

Next, as illustrated in FIG. 14, the system control circuit 24 changes the internal gate PY2 from the ON state to the OFF state at time T24 when a given period of time has elapsed from the time T23. Note that, at the time T24, the discharge transistor OFG is maintained in the ON state, and the internal gate PY1 is maintained in the OFF state.

Figure 15E:
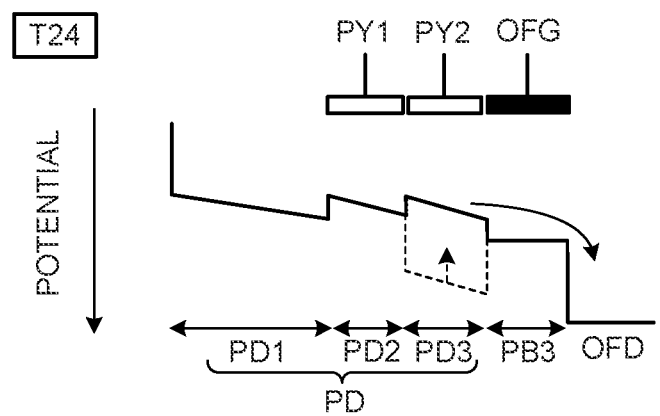
FIG. 15E is a diagram illustrating transition of a potential diagram in the light receiving pixel according to the second modification of the first embodiment of the disclosure.

As a result, as illustrated in FIG. 15E, the potential of the third region PD3 becomes shallower than the potential of the potential barrier PB3, and thus the charges accumulated in the third region PD3 are transferred (that is, discharged) to the discharge floating diffusion OFD.

Figure 15F:
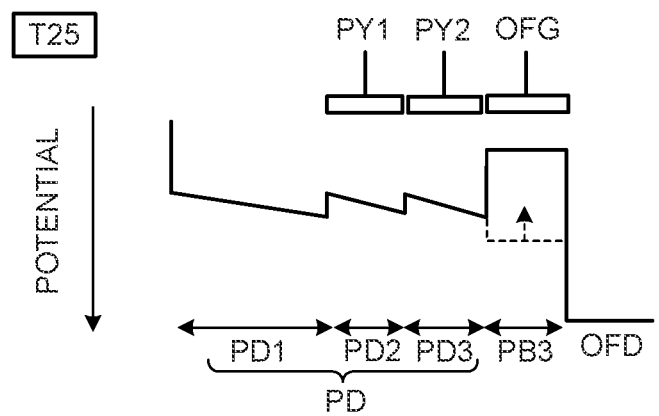
FIG. 15F is a diagram illustrating transition of a potential diagram in the light receiving pixel according to the second modification of the first embodiment of the disclosure.

Next, as illustrated in FIG. 14, the system control circuit 24 changes the discharge transistor OFG from the ON state to the OFF state at time T25 when a given period of time has elapsed from the time T24. As a result, as illustrated in FIG. 15F, the potentials of the second region PD2, the third region PD3, and the potential barrier PB3 return to preset depths.

By the processing described above, all the charges accumulated in the photodiode PD are discharged from the discharge floating diffusion OFD, the reset processing (PD reset processing) of the photodiode PD is completed, and exposure in the photodiode PD is started.

Note that, in parallel with the PD reset processing, the system control circuit 24 performs processing of resetting the charge holding unit MEM and the floating diffusion FD, however, description of such processing is omitted.

Next, as illustrated in FIG. 14, the system control circuit 24 performs the charge accumulation processing from the time T25 to time T26 when a given exposure time elapses.

Figure 15G:
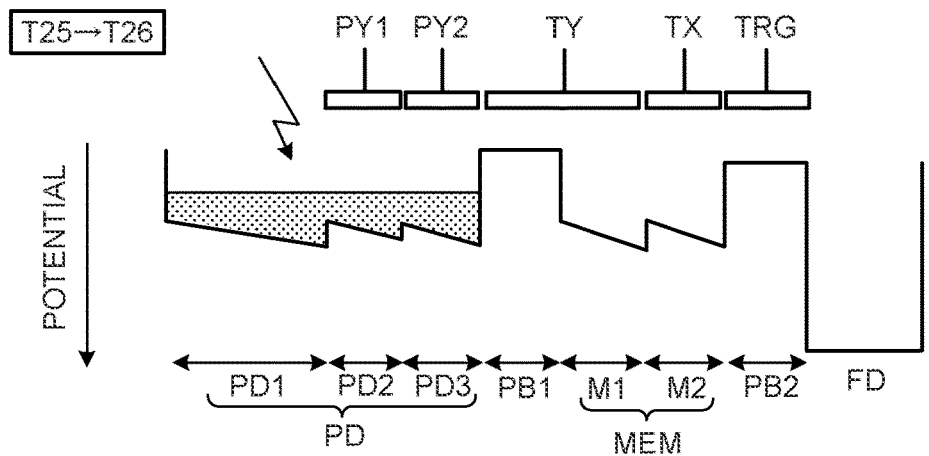
FIG. 15G is a diagram illustrating transition of a potential diagram in the light receiving pixel according to the second modification of the first embodiment of the disclosure.

FIG. 15G is a potential diagram in the light receiving pixel 11 that is performing the charge accumulation processing of the second modification. As illustrated in FIG. 15G, in the charge accumulation processing of the second modification, all of the internal gates PY1, PY2, and TX and the transfer transistors TY and TRG are in the OFF state.

As a result, the system control circuit 24 can cause the photodiode PD to accumulate charges generated by photoelectric conversion of light incident on the photodiode PD.

Next, as illustrated in FIG. 14, the system control circuit 24 changes the internal gates PY1, PY2, TX and the transfer transistor TY from the OFF state to the ON state at the time T26 when a given exposure time has elapsed from the time T25. Note that, at the time T26, the transfer transistor TRG is maintained in the OFF state.

Figure 15H:
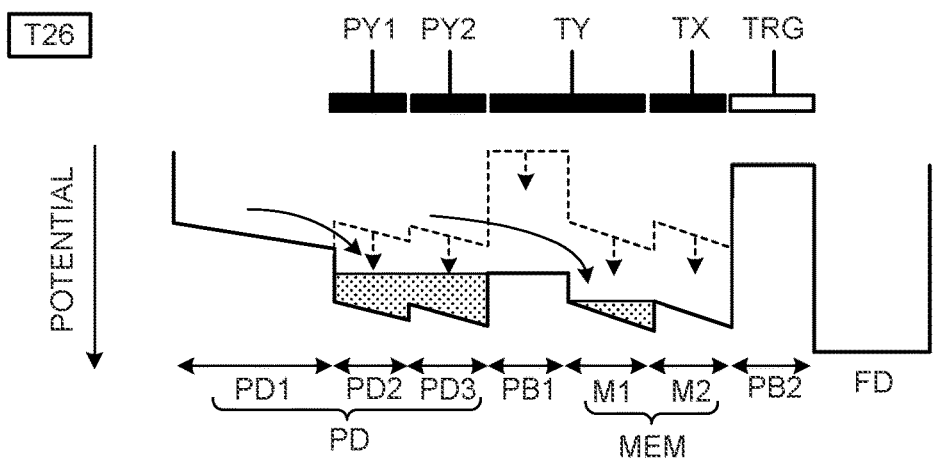
FIG. 15H is a diagram illustrating transition of a potential diagram in the light receiving pixel according to the second modification of the first embodiment of the disclosure.

As a result, as illustrated in FIG. 15H, the potentials of the second region PD2, the third region PD3, and a first region M1 become deeper than the potentials of the first region PD1 and the potential barrier PB1. Therefore, the charges accumulated in the photodiode PD are transferred to the second region PD2, the third region PD3, and the first region M1.

Next, as illustrated in FIG. 14, the system control circuit 24 changes the internal gate PY1 from the ON state to the OFF state at time T27 when a given period of time has elapsed from the time T26. Note that, at the time T27, the internal gates PY2 and TX and the transfer transistor TY are maintained in the ON state, and the transfer transistor TRG is maintained in the OFF state.

Figure 15I:
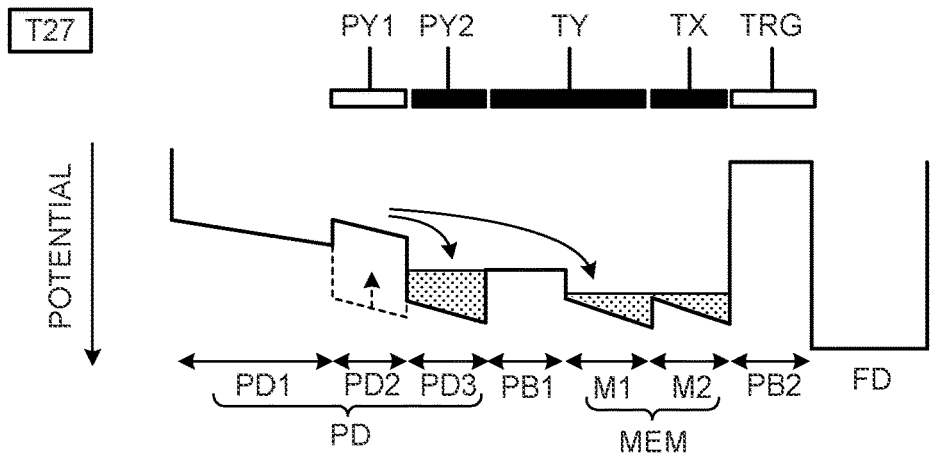
FIG. 15I is a diagram illustrating transition of a potential diagram in the light receiving pixel according to the second modification of the first embodiment of the disclosure.

As a result, as illustrated in FIG. 15I, the potential of the second region PD2 becomes shallower than the potential of the third region PD3, and thus the charges accumulated in the second region PD2 are transferred to the third region PD3 and the charge holding unit MEM.

Next, as illustrated in FIG. 14, the system control circuit 24 changes the internal gate PY2 from the ON state to the OFF state at time T28 when a given period of time has elapsed from the time T27. Note that, at the time T28, the internal gate TX and the transfer transistor TY are maintained in the ON state, and the internal gate PY1 and the transfer transistor TRG are maintained in the OFF state.

Figure 15J:
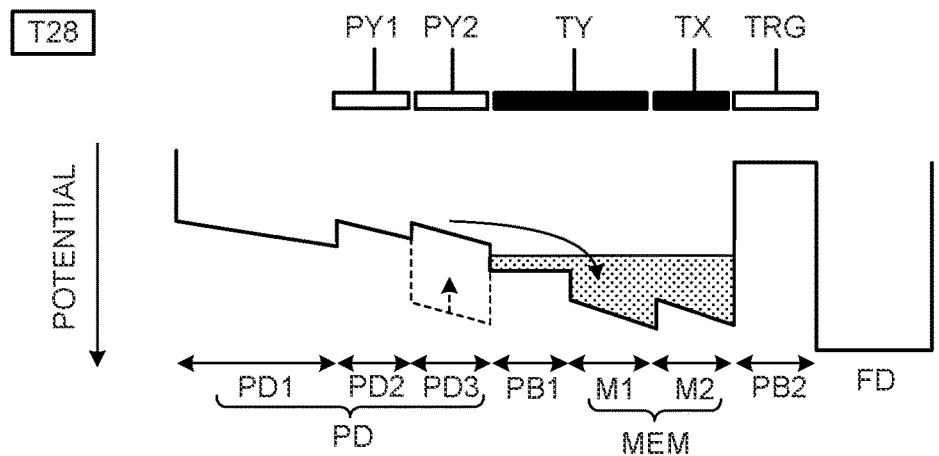
FIG. 15J is a diagram illustrating transition of a potential diagram in the light receiving pixel according to the second modification of the first embodiment of the disclosure.

As a result, as illustrated in FIG. 15J, the potential of the third region PD3 becomes shallower than the potential of the potential barrier PB1, and thus the charges accumulated in the third region PD3 are transferred to the potential barrier PB1 and the charge holding unit MEM.

Next, as illustrated in FIG. 14, the system control circuit 24 changes the transfer transistor TY from the ON state to the OFF state at time T29 when a given period of time has elapsed from the time T28. Note that, at the time T29, the internal gate TX is maintained in the ON state, and the internal gates PY1 and PY2 and the transfer transistor TRG are maintained in the OFF state.

Figure 15K:
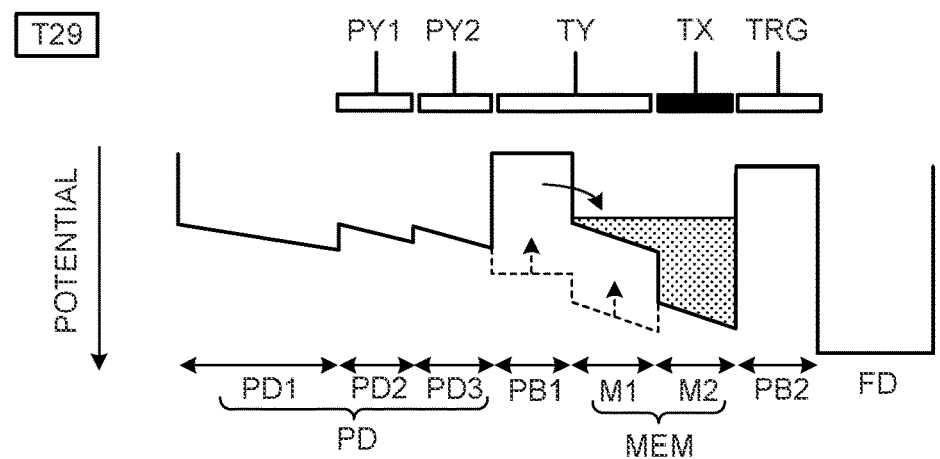
FIG. 15K is a diagram illustrating transition of a potential diagram in the light receiving pixel according to the second modification of the first embodiment of the disclosure.
Figure 15L:
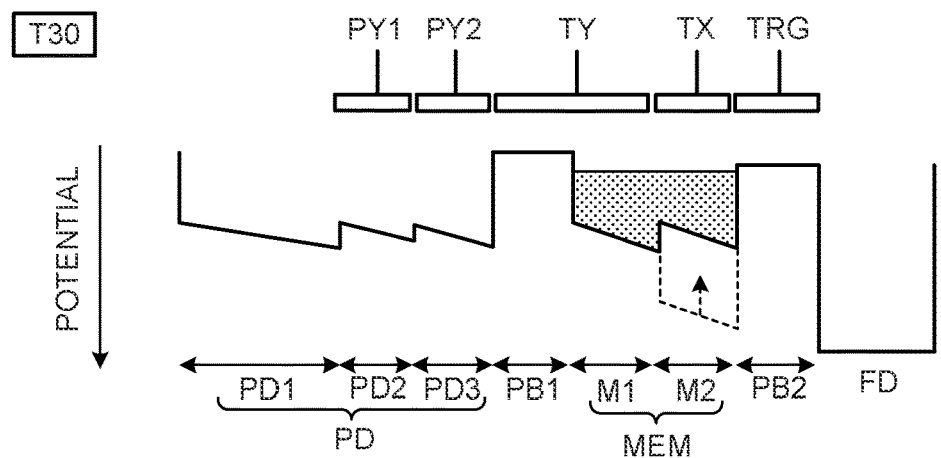
FIG. 15L is a diagram illustrating transition of a potential diagram in the light receiving pixel according to the second modification of the first embodiment of the disclosure.

As a result, as illustrated in FIG. 15K, the potential of the potential barrier PB1 becomes shallower than the potential of the charge holding unit MEM, and thus the charges accumulated in the potential barrier PB1 are transferred to the charge holding unit MEM.

Next, as illustrated in FIG. 14, the system control circuit 24 changes the internal gate TX from the ON state to the OFF state at time T30 when a given period of time has elapsed from the time T29. As a result, as illustrated in FIG. 15K, the potential of the second region M2 returns to a preset depth.

With the processing described above, all the charges accumulated in the photodiode PD are transferred to the charge holding unit MEM, and the charge transfer processing from the photodiode PD to the charge holding unit MEM is completed.

Note that, also in the second modification, the FD reset processing and the FD charge transfer processing are performed subsequently to the charge transfer processing, however, since these types of processing are similar to those of the first embodiment described above, illustration and detailed description thereof are omitted.

In the second modification described above, the plurality of internal gates PY1 and PY2 are included inside the photodiode PD. As a result, charges accumulated in the photodiode PD can be more smoothly transferred to the charge holding unit MEM.

Figure 16:
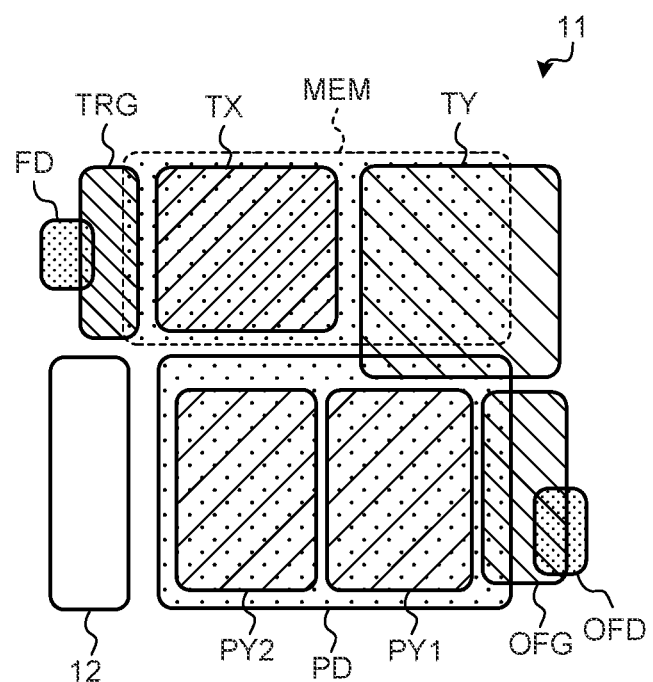
FIG. 16 is a diagram illustrating an example of a planar structure of a light receiving pixel according to a third modification of the first embodiment of the disclosure.

Note that, in the second modification, an example in which the plurality of internal gates PY1 and PY2 is arranged in a partial region of the photodiode PD has been described; however, as illustrated in FIG. 16, the plurality of internal gates PY1 and PY2 may be arranged in the entire photodiode PD. FIG. 16 is a diagram illustrating an example of a planar structure of a light receiving pixel 11 according to a third modification of the first embodiment of the disclosure.

Also with this structure, with a plurality of internal gates PY1 and PY2 included inside a photodiode PD, charges accumulated in the photodiode PD can be more smoothly transferred to the charge holding unit MEM.

Furthermore, in the second modification and the third modification, an example in which the two internal gates PY1 and PY2 are provided inside the photodiode PD has been described, however, the number of internal gates included inside the photodiode PD is not limited to two, and three or more internal gates may be included.

Second Embodiment

Figure 17:
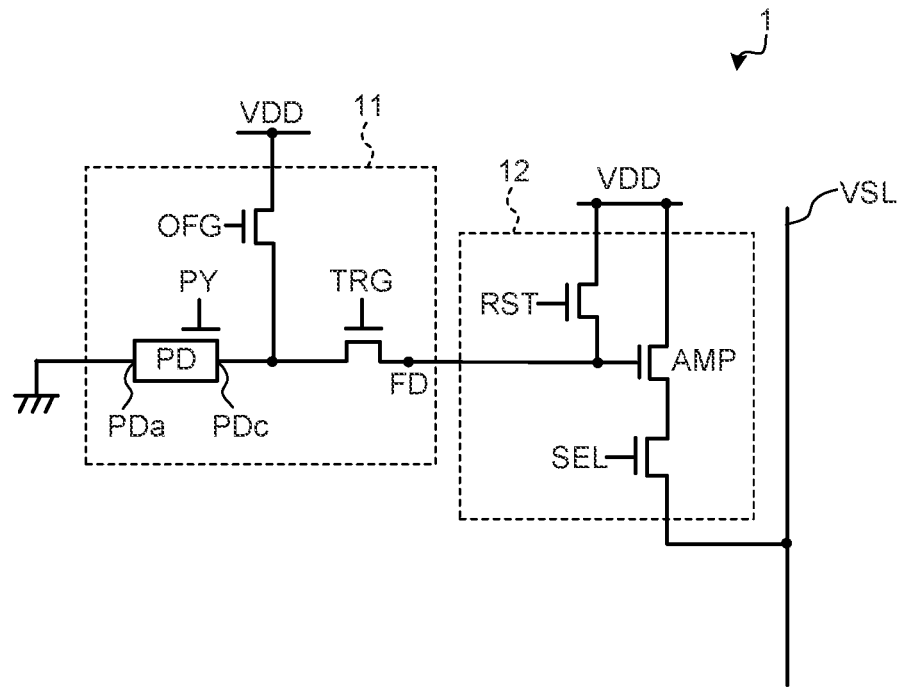
FIG. 17 is a diagram illustrating an example of a circuit configuration of a light receiving pixel and a readout circuit according to a second embodiment of the disclosure.

Next, a circuit configuration of a light receiving pixel 11 according to a second embodiment will be described with reference to FIG. 17. FIG. 17 is a diagram illustrating an example of a circuit configuration of the light receiving pixel 11 and a readout circuit 12 according to the second embodiment of the disclosure. Note that, in the example of FIG. 17, a case where one light receiving pixel 11 is allocated to one readout circuit 12 is illustrated.

As illustrated in FIG. 17, the light receiving pixel 11 according to the second embodiment includes a photodiode PD, a transfer transistor TRG, a floating diffusion FD, a discharge transistor OFG, and an internal gate PY.

That is, the light receiving pixel 11 according to the second embodiment does not include the charge holding unit MEM and portions related to the charge holding unit MEM (the transfer transistor TY and the internal gate TX), as compared with the light receiving pixel 11 according to the first embodiment illustrated in FIG. 2 and others Therefore, hereinafter, portions different from those of the first embodiment will be mainly described.

A cathode PDc of the photodiode PD is electrically connected to a source of the transfer transistor TRG, and an anode PDa of the photodiode PD is electrically connected to a reference potential line (for example, ground GND).

The transfer transistor TRG is connected between the photodiode PD and the floating diffusion FD. The transfer transistor TRG transfers a charge held in the photodiode PD to the floating diffusion FD in response to a control signal applied to a gate.

For example, in a case where the transfer transistor TRG is turned on, the charge held in the photodiode PD is transferred to the floating diffusion FD via the transfer transistor TRG.

A drain of the transfer transistor TRG is electrically connected to the floating diffusion FD, and the gate of the transfer transistor TRG is connected to a pixel drive line HSL.

The floating diffusion FD is a floating diffusion region that temporarily holds the charge output from the photodiode PD via the transfer transistor TRG. The floating diffusion FD is connected to, for example, the reset transistor RST and is connected to the vertical signal line VSL via an amplification transistor AMP and a selection transistor SEL.

The internal gate PY controls the potential of a partial region in the photodiode PD in response to a control signal applied to the gate. Specifically, in a case where the internal gate PY is turned on, the internal gate PY deepens the potential of a region adjacent to the transfer transistor TRG inside the photodiode PD.

On the other hand, in a case where the internal gate PY is turned off, the internal gate PY makes the potential of the region, which is adjacent to the transfer transistor TRG inside the photodiode PD, shallow.

The reset transistor RST is connected between the floating diffusion FD and the power supply line VDD. The reset transistor RST discharges charges accumulated in the floating diffusion FD in response to a control signal applied to a gate and initializes (resets) the floating diffusion FD.

For example, in a case where the reset transistor RST is turned on, the potential of the floating diffusion FD is reset to the potential level of the power supply line VDD. That is, in a case where the reset transistor RST is turned on, the floating diffusion FD is initialized.

Figure 18:
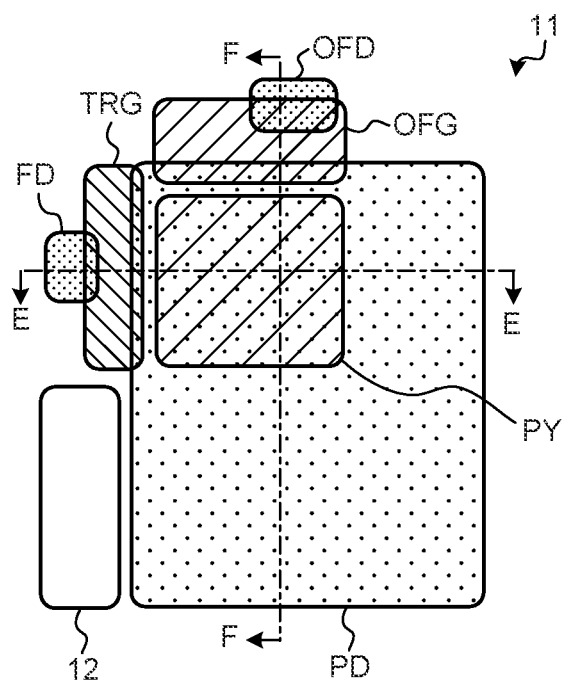
FIG. 18 is a diagram illustrating an example of a planar structure of the light receiving pixel according to the second embodiment of the disclosure.
Figure 19:
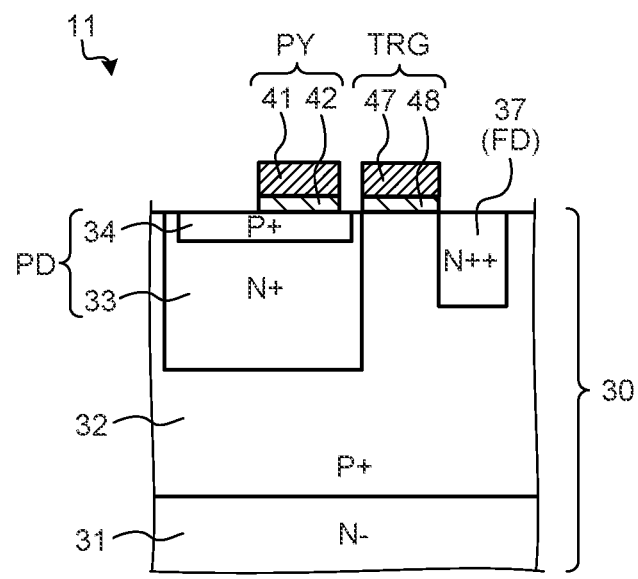
FIG. 19 is a cross-sectional view taken along line E-E illustrated in FIG. 18 as viewed in the direction of arrows.
Figure 20:
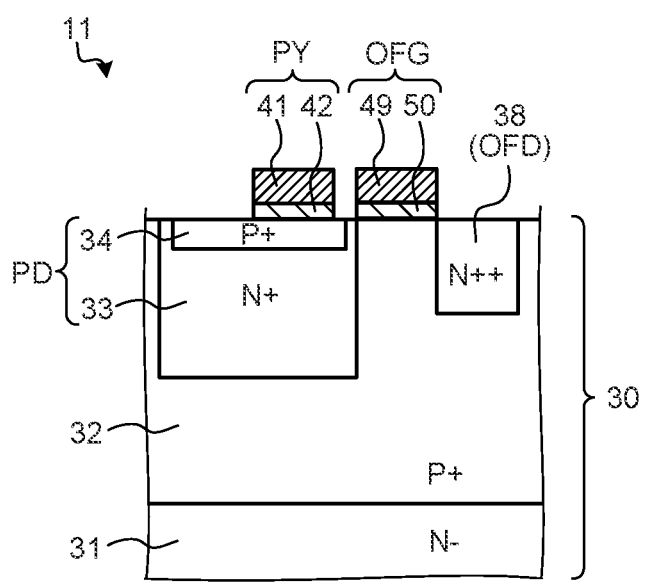
FIG. 20 is a cross-sectional view taken along line F-F illustrated in FIG. 18 as viewed in the direction of arrows.

Next, a planar structure and a cross-sectional structure of the light receiving pixel 11 according to the second embodiment will be described with reference to FIGS. 18 to 20. FIG. 18 is a diagram illustrating an example of the planar structure of the light receiving pixel 11 according to the second embodiment of the disclosure, FIG. 19 is a cross-sectional view taken along line E-E illustrated in FIG. 18 as viewed in the direction of arrows, and FIG. 20 is a cross-sectional view taken along line F-F illustrated in FIG. 18 as viewed in the direction of arrows. Note that FIGS. 18 to 20 are schematic diagrams and are not necessarily strictly illustrated.

As illustrated in FIG. 19, the internal gate PY is provided on a surface of a semiconductor substrate 30 and includes a gate electrode 41 and a gate insulating film 42. A gate of a transfer transistor TRG is provided on the surface of the semiconductor substrate 30 and includes a gate electrode 47 and a gate insulating film 48. Note that, in the light receiving pixel 11 according to the second embodiment, light is incident from the back surface side of the semiconductor substrate 30.

As illustrated in FIG. 18, the internal gate PY is disposed inside the photodiode PD in plan view and is disposed adjacent to the transfer transistor TRG.

The floating diffusion FD, the discharge floating diffusion OFD, and the readout circuit 12 are formed around a region including the photodiode PD in plan view. The transfer transistor TRG is formed between the floating diffusion FD and the photodiode PD in plan view.

A discharge transistor OFG is formed between the discharge floating diffusion OFD and the photodiode PD in plan view. In addition, the internal gate PY is disposed at a position adjacent to the discharge transistor OFG in plan view.

Figure 21:
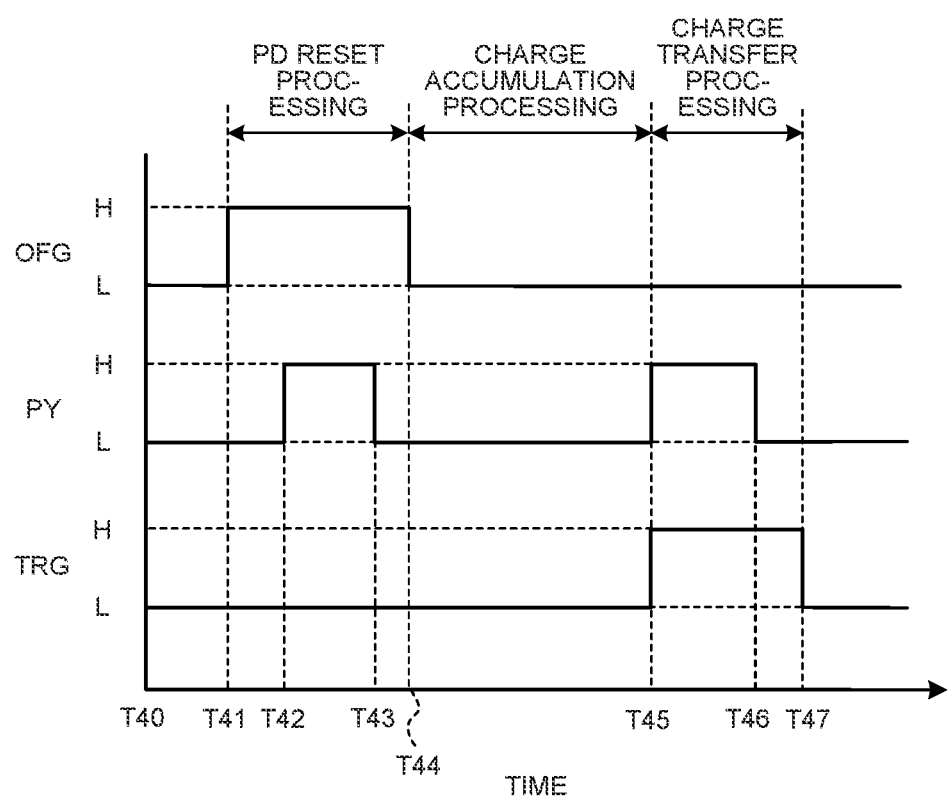
FIG. 21 is a timing chart illustrating operation of each unit in pixel driving processing according to the second embodiment of the disclosure.

Next, details of pixel driving processing according to the second embodiment will be described with reference to FIGS. 21, 22A, 22B, 22C, and 22D. FIG. 21 is a timing chart illustrating operation of each unit in the pixel driving processing according to the second embodiment of the disclosure, and FIGS. 22A, 22B, 22C, and 22D are diagrams illustrating transition in a potential diagram in the light receiving pixel 11 according to the second embodiment of the disclosure.

As illustrated in FIG. 21, the system control circuit 24 (see FIG. 1) performs PD reset processing from time T41 to time T44. Since the PD reset processing is similar to the PD reset processing of the first embodiment illustrated in FIGS. 7A, 7B, 7C, 7D, and 7E and others, detailed description thereof is omitted.

In parallel with the PD reset processing, the system control circuit 24 also performs processing of resetting the floating diffusion FD, however, the description of such processing is omitted.

As illustrated in FIG. 21, the system control circuit 24 performs charge accumulation processing from the time T44 to time T45 when a given exposure time elapses.

Figure 22A:
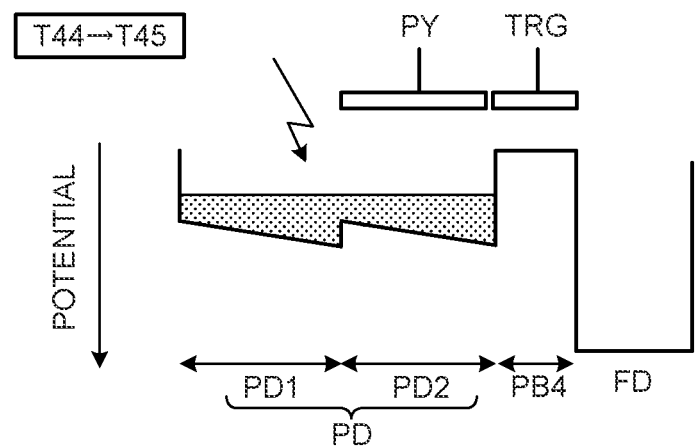
FIG. 22A is a diagram illustrating transition of a potential diagram in the light receiving pixel according to the second embodiment of the disclosure.

Note that as illustrated in FIG. 22A and others described below, the photodiode PD has a first region PD1 not covered with the internal gate PY and a second region PD2 covered with the internal gate PY.

The potential of the first region PD1 is designed to become gradually deeper as it approaches the second region PD2, and the potential of the second region PD2 is designed to become gradually deeper as it approaches a potential barrier PB4.

Note that the potential barrier PB4 is positioned between the photodiode PD and the floating diffusion FD. Furthermore, the transfer transistor TRG is disposed between the photodiode PD and the floating diffusion FD (that is, the potential barrier PB4).

FIG. 22A is a potential diagram in the light receiving pixel 11 that is performing the charge accumulation processing of the second embodiment. As illustrated in FIG. 22A, in the charge accumulation processing of the second embodiment, both the internal gate PY1 and the transfer transistor TRG are in an OFF state.

As a result, the system control circuit 24 can cause the photodiode PD to accumulate charges generated by photoelectric conversion of light incident on the photodiode PD.

Next, as illustrated in FIG. 21, the system control circuit 24 changes the internal gate PY and the transfer transistor TRG from the OFF state to the ON state at the time T45 when a given exposure time has elapsed from the time T44.

Figure 22B:
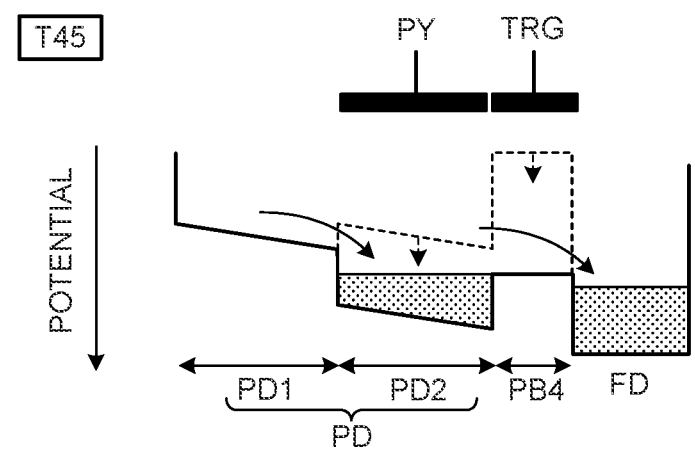
FIG. 22B is a diagram illustrating transition of a potential diagram in the light receiving pixel according to the second embodiment of the disclosure.

As a result, as illustrated in FIG. 22B, the potentials of the second region PD2 and the potential barrier PB4 become deeper than the potential of the first region PD1. Therefore, charges accumulated in the photodiode PD are transferred to the second region PD2 and the floating diffusion FD.

Next, as illustrated in FIG. 21, the system control circuit 24 changes the internal gate PY from the ON state to the OFF state at time T46 when a given period of time has elapsed from the time T45. Note that, at the time T46, the transfer transistor TRG is maintained in the ON state.

Figure 22C:
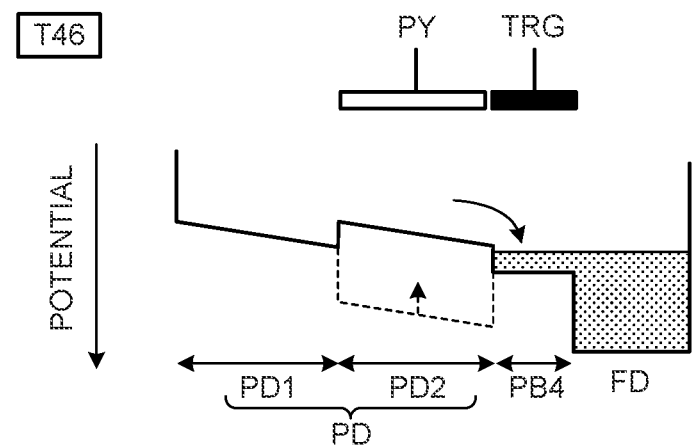
FIG. 22C is a diagram illustrating transition of a potential diagram in the light receiving pixel according to the second embodiment of the disclosure.

As a result, as illustrated in FIG. 22C, the potential of the second region PD2 becomes shallower than the potential of the potential barrier PB4, and thus the charges accumulated in the second region PD2 are transferred to the potential barrier PB4 and the floating diffusion FD.

Next, as illustrated in FIG. 21, the system control circuit 24 changes the transfer transistor TRG from the ON state to the OFF state at time T47 when a given period of time has elapsed from the time T46. Note that, at the time T47, the internal gate PY is maintained in the OFF state.

Figure 22D:
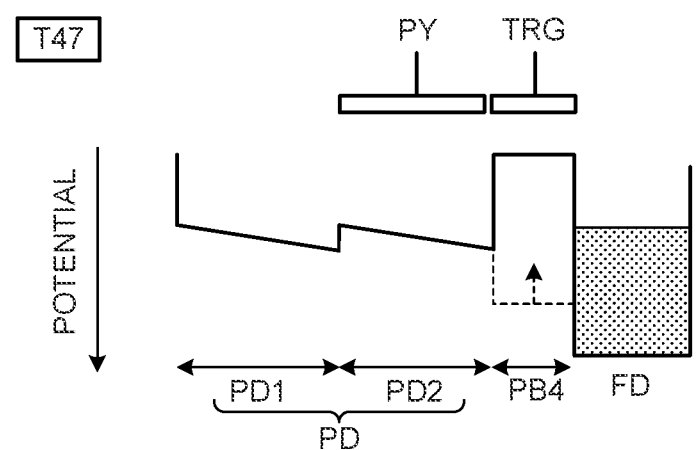
FIG. 22D is a diagram illustrating transition of a potential diagram in the light receiving pixel according to the second embodiment of the disclosure.

As a result, as illustrated in FIG. 22D, the potential of the potential barrier PB4 becomes shallower than the potential of the floating diffusion FD, and thus the charges accumulated in the potential barrier PB4 are transferred to the floating diffusion FD.

With the processing described above, all the charges accumulated in the photodiode PD are transferred to the floating diffusion FD, and the charge transfer processing from the photodiode PD to the floating diffusion FD is completed.

Note that, in the charge transfer processing described above, the system control circuit 24 changes the selection transistor SEL (see FIG. 2) to the ON state. As a result, a pixel signal at a signal level corresponding to the potential of the floating diffusion FD is generated in the amplification transistor AMP (see FIG. 2), and the generated pixel signal is output to the vertical signal line VSL (see FIG. 2) via the selection transistor SEL.

In the second embodiment described above, similarly to the first embodiment, the internal gate PY that deepens the potential of the second region PD2 on the downstream side in the photodiode PD is included.

As a result, even in a case where the potential of the first region PD1 on the upstream side is designed to be rather deep (for example, substantially equal to the second region M2), all the charges accumulated in the photodiode PD can be transferred to the floating diffusion FD.

That is, in the second embodiment, the potential of the first region PD1 of the photodiode PD can be designed to be rather deep. Therefore, according to the second embodiment, the saturation charge amount of the photodiode PD can be enhanced.

Furthermore, in the second embodiment, as illustrated in FIG. 21, the internal gate PY is preferably disposed at a position adjacent to the transfer transistor TRG in plan view.

As a result, as illustrated in FIGS. 22A, 22B, 22C, and 22D and others, the system control circuit 24 can smoothly transfer the charges accumulated in the photodiode PD to the floating diffusion FD via the second region PD2 and the potential barrier PB4.

In addition, in the second embodiment, the internal gate PY is preferably disposed at a position adjacent to the discharge transistor OFG in plan view. As a result, similarly to the first embodiment, the system control circuit 24 can smoothly discharge the charges remaining in the photodiode PD from the discharge floating diffusion OFD.

[Manufacturing Process]

Next, a manufacturing process of the light receiving pixel 11 according to the first embodiment will be described with reference to FIGS. 23A, 23B, 23C, and 23D. FIGS. 23A, 23B, 23C, and 23D are diagrams illustrating an example of the manufacturing process of the light receiving pixel 11 according to the first embodiment of the disclosure.

Figure 23A:
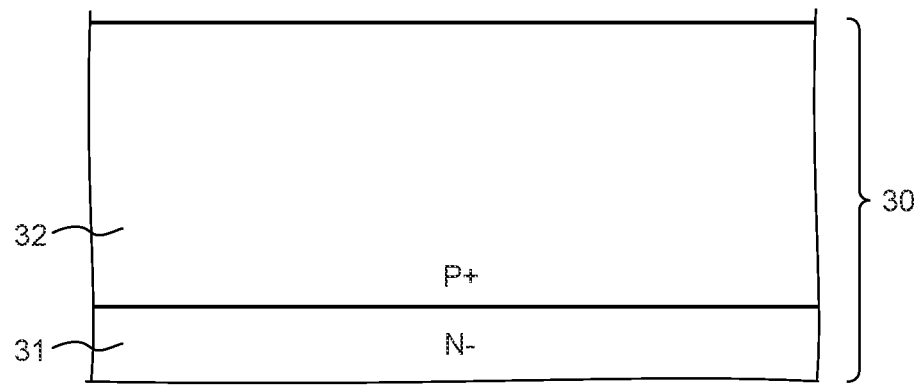
FIG. 23A is a diagram illustrating an example of a manufacturing process of the light receiving pixel 11 according to the first embodiment of the disclosure.

First, as illustrated in FIG. 23A, a p-well layer 32 is formed on a surface of an N-type semiconductor substrate 30. The p-well layer 32 can be formed, for example, by ion-implanting a p-type impurity (acceptor).

Figure 23B:
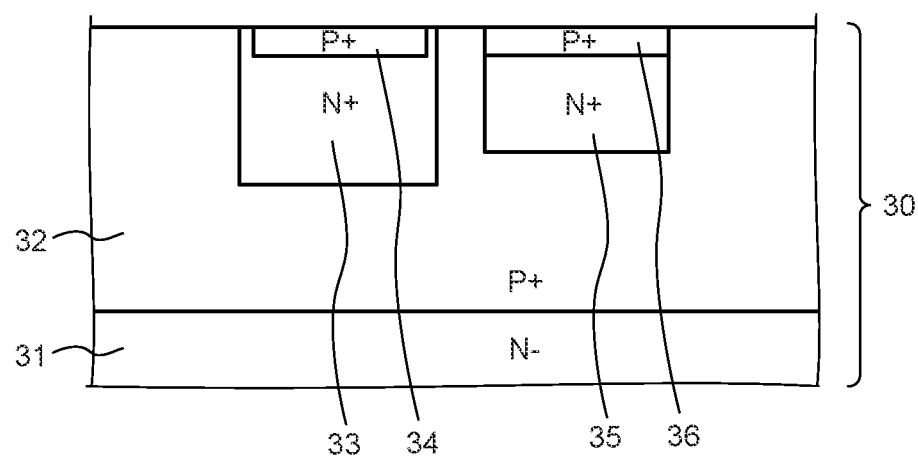
FIG. 23B is a diagram illustrating an example of a manufacturing process of the light receiving pixel 11 according to the first embodiment of the disclosure.

Next, as illustrated in FIG. 23B, n-type semiconductor regions 33 and 35 and p-type semiconductor regions 34 and 36 are formed in the p-well layer 32. The n-type semiconductor regions 33 and 35 can be formed, for example, by ion-implanting an n-type impurity (donor). The p-type semiconductor regions 34 and 36 can be formed, for example, by ion-implanting a p-type impurity (acceptor).

Figure 23C:
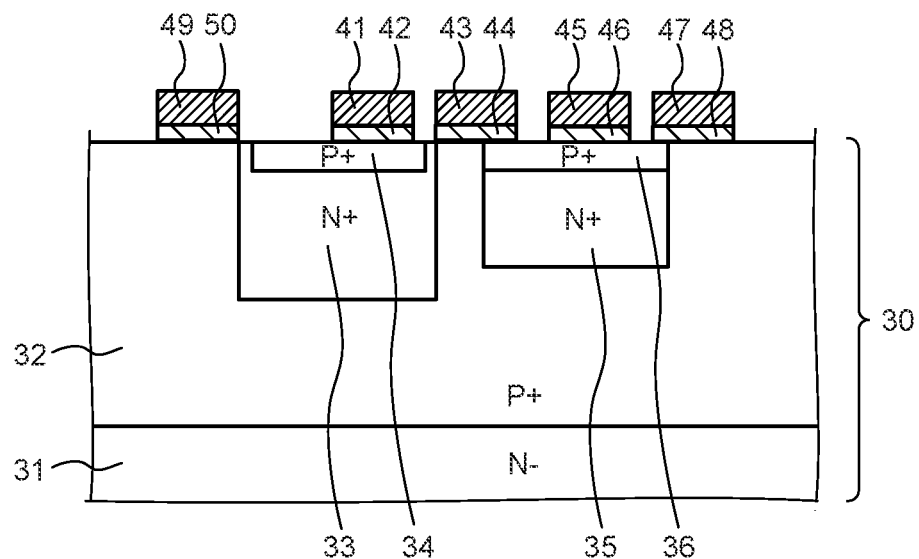
FIG. 23C is a diagram illustrating an example of a manufacturing process of the light receiving pixel 11 according to the first embodiment of the disclosure.

Next, as illustrated in FIG. 23C, gate electrodes 41, 43, 45, 47, and 49 and gate insulating films 42, 44, 46, 48, and 50 are formed on the surface of the semiconductor substrate 30. The gate electrodes 41, 43, 45, 47, and 49 and the gate insulating films 42, 44, 46, 48, and 50 can be formed by, for example, forming a silicon oxide film and a polysilicon film and then performing etching processing.

Figure 23D:
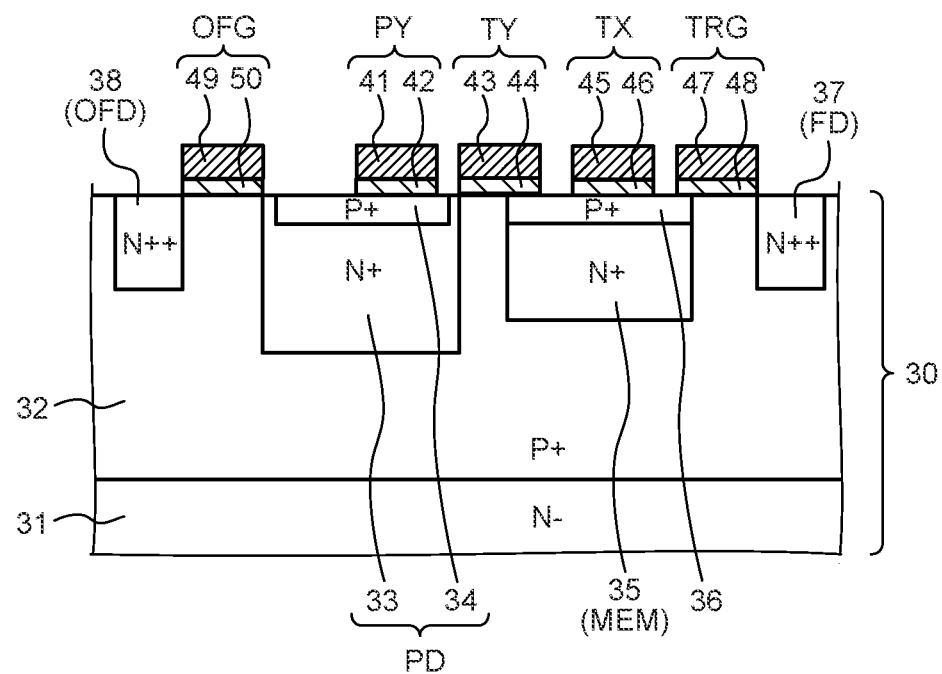
FIG. 23D is a diagram illustrating an example of a manufacturing process of the light receiving pixel 11 according to the first embodiment of the disclosure.

Next, as illustrated in FIG. 23D, n-type semiconductor regions 37 and 38 are formed on the surface of the semiconductor substrate 30. The n-type semiconductor regions 37 and 38 can be formed, for example, by ion-implanting an n-type impurity (donor).

Thereafter, a wiring layer is formed on the surface of the semiconductor substrate 30, a wiring substrate is bonded, and a back surface of the semiconductor substrate 30 is further ground to a given thickness. Then, a light-shielding wall, a negative fixed charge film, a flat film, and others are formed from the back surface side of the semiconductor substrate 30, and an on-chip lens (OCL) is formed for each pixel, thereby completing the light receiving pixel 11 of the first embodiment.

[Pixel Driving Processing]

Figure 24:
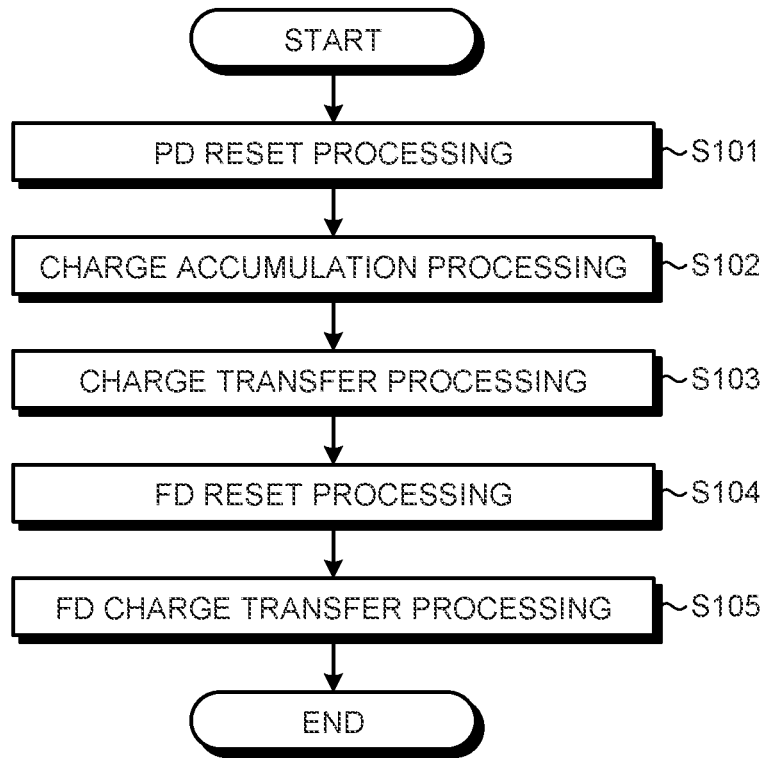
FIG. 24 is a flowchart illustrating a processing procedure of the pixel driving processing according to the first embodiment of the disclosure.

Next, details of pixel driving processing executed by the solid-state imaging element 1 according to the embodiment will be described with reference to FIG. 24. FIG. 24 is a flowchart illustrating a processing procedure of the pixel driving processing according to the first embodiment of the disclosure.

First, the system control circuit 24 performs the PD reset processing of resetting the photodiode PD (step S101). Next, the system control circuit 24 performs the charge accumulation processing of accumulating charges generated by photoelectric conversion of incident light in the photodiode PD that has been reset (step S102).

Note that, in the pixel driving processing according to the first modification of the first embodiment, in step S102, the internal gate PY is controlled to be in the ON state. As a result, the saturation charge amount of the photodiode PD can be further enhanced.

Next, the system control circuit 24 performs the charge transfer processing of transferring the charges accumulated in the photodiode PD to the charge holding unit MEM (step S103). In the pixel driving processing according to the first embodiment, in step S103, the internal gate PY is controlled to be in the ON state.

As a result, even in a case where the potential of the first region PD1 of the photodiode PD is designed to be rather deep, all charges can be transferred to the charge holding unit MEM. Therefore, according to the first embodiment, the saturation charge amount of the photodiode PD can be enhanced.

Next, the system control circuit 24 performs the FD reset processing of resetting the floating diffusion FD (step S104). Then, the system control circuit 24 performs the FD charge transfer processing of transferring the charges accumulated in the charge holding unit MEM to the floating diffusion FD (step S105). A series of pixel driving processing is completed.

[Effects]

A solid-state imaging element 1 according to each of the embodiments includes a photoelectric conversion unit (photodiode PD), a transfer transistor TY (TRG), and (an) internal gate(s) PY (PY1 and PY2). The photoelectric conversion unit (photodiode PD) photoelectrically converts incident light. The transfer transistor TY (TRG) transfers charge generated by the photoelectric conversion unit (photodiode PD). The internal gate(s) PY (PY1 and PY2) is(are) disposed adjacent to the transfer transistor TY (TRG) inside the photoelectric conversion unit (photodiode PD) and deepens the potential of at least a partial region in the photoelectric conversion unit (photodiode PD).

As a result, the saturation charge amount of the photodiode PD can be enhanced.

Meanwhile, the solid-state imaging element 1 according to the first embodiment further includes a charge holding unit MEM and a floating diffusion FD. The charge holding unit MEM holds charges transferred from the photoelectric conversion unit (photodiode PD). The floating diffusion FD holds the charges transferred from the charge holding unit MEM. Furthermore, the transfer transistor TY transfers the charge generated by the photoelectric conversion unit (photodiode PD) to the charge holding unit MEM.

As a result, the saturation charge amount of the photodiode PD can be improved in the solid-state imaging element 1 of the global shutter (GS) type.

Furthermore, the solid-state imaging element 1 according to the first embodiment further includes another internal gate (internal gate TX). The other internal gate (internal gate TX) is disposed adjacent to the transfer transistor TY inside the charge holding unit MEM and deepens the potential of at least a partial region in the charge holding unit MEM.

As a result, the charges accumulated in the charge holding unit MEM can be smoothly transferred to the floating diffusion FD via the second region M2 and the potential barrier PB2.

Moreover, the solid-state imaging element 1 according to each of the embodiments further includes a discharge transistor OFG that discharges a charge remaining in a photoelectric conversion unit (photodiode PD). Furthermore, the internal gate PY (PY2) is disposed adjacent to the discharge transistor OFG.

As a result, the charge remaining in the photodiode PD can be smoothly discharged from the discharge floating diffusion OFD via the second region PD2 and the potential barrier PB3.

Furthermore, in the solid-state imaging element 1 according to each of the embodiments, a plurality of internal gates is included (internal gates PY1, and PY2). In addition, the plurality of internal gates PY1 and PY2 each deepens the potential of an adjacent region in the photoelectric conversion unit (photodiode PD).

As a result, the charges accumulated in the photodiode PD can be more smoothly transferred to the charge holding unit MEM or the floating diffusion FD.

Furthermore, in the solid-state imaging element 1 according to each of the embodiments, the internal gate(s) PY (PY1 and PY2) deepen(s) the potential of at least a partial region in the photoelectric conversion unit (photodiode PD) in a charge transfer period.

As a result, the charges accumulated in the photodiode PD can be smoothly transferred to the charge holding unit MEM or the floating diffusion FD.

Furthermore, in the solid-state imaging element 1 according to each of the embodiments, the internal gate(s) PY (PY1 and PY2) deepen(s) the potential of at least a partial region in the photoelectric conversion unit (photodiode PD) in a charge accumulation period and a charge transfer period.

As a result, the saturation charge amount of the photodiode PD can be further enhanced.

Furthermore, a control method of the solid-state imaging element 1 according to each of the embodiments includes the charge accumulation process (step S102) and the charge transfer process (step S103). In the charge accumulation process (step S102), charges generated in the photoelectric conversion unit (photodiode PD) by incident light are accumulated in the photoelectric conversion unit (photodiode PD). In the charge transfer process (step S103), the charges accumulated in the photoelectric conversion unit (photodiode PD) are transferred by operating the transfer transistor TY (TRG). Furthermore, the charge transfer process (step S103) includes a process of deepening the potential of a region adjacent to the transfer transistor TY (TRG) in the photoelectric conversion unit (photodiode PD).

As a result, the saturation charge amount of the photodiode PD can be enhanced.

Furthermore, in the control method of the solid-state imaging element 1 according to each embodiment, the charge accumulation process (step S102) includes a process of deepening the potential of the region adjacent to the transfer transistor TY (TRG) in the photoelectric conversion unit (photodiode PD).

As a result, the saturation charge amount of the photodiode PD can be further enhanced.

[Electronic Device]

Note that the present disclosure is not limited to application to solid-state imaging elements. That is, the disclosure is applicable to all electronic devices having a solid-state imaging element, such as camera modules, imaging devices, portable terminal devices having an imaging function, or copying machines using a solid-state imaging element in an image reading unit, in addition to the solid-state imaging elements.

Examples of such imaging devices include digital still cameras and video cameras. Examples of portable terminal devices having such an imaging function include smartphones and tablet terminals.

Figure 25:
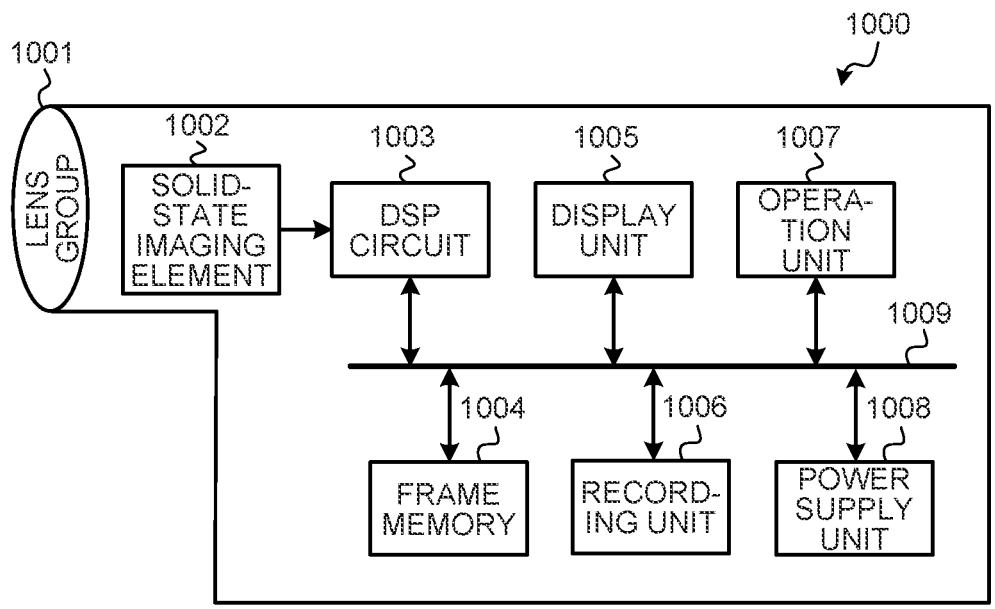
FIG. 25 is a block diagram illustrating a configuration example of an imaging device as an electronic device to which the technology according to the disclosure is applied.

FIG. 25 is a block diagram illustrating a configuration example of a imaging device as an electronic device 1000 to which the technology according to the disclosure is applied. The electronic device 1000 in FIG. 25 is, for example, an electronic device such as an imaging device, such as a digital still camera or a video camera, or a portable terminal device such as a smartphone or a tablet terminal.

In FIG. 25, the electronic device 1000 includes a lens group 1001, a solid-state imaging element 1002, a DSP circuit 1003, a frame memory 1004, a display unit 1005, a recording unit 1006, an operation unit 1007, and a power supply unit 1008.

Furthermore, in the electronic device 1000, the DSP circuit 1003, the frame memory 1004, the display unit 1005, the recording unit 1006, the operation unit 1007, and the power supply unit 1008 are mutually connected via a bus line 1009.

The lens group 1001 captures incident light (image light) from a subject and forms an image on an imaging plane of the solid-state imaging element 1002. The solid-state imaging element 1002 corresponds to the solid-state imaging element 1 according to each of the above-described embodiments and converts the amount of incident light imaged on the imaging plane by the lens group 1001 into an electric signal for every pixel and outputs the electric signal as a pixel signal.

The DSP circuit 1003 is a camera signal processing circuit that processes a signal supplied from the solid-state imaging element 1002. The frame memory 1004 temporarily holds image data processed by the DSP circuit 1003 for every frame.

The display unit 1005 includes, for example, a panel type display device such as a liquid crystal panel or an organic electro luminescence (EL) panel and displays a moving image or a still image captured by the solid-state imaging element 1002. The recording unit 1006 records image data of a moving image or a still image captured by the solid-state imaging element 1002 on a recording medium such as a semiconductor memory or a hard disk.

The operation unit 1007 issues operation commands for various functions of the electronic device 1000 on the basis of an operation by a user. The power supply unit 1008 supplies various power sources serving as operation power sources of the DSP circuit 1003, the frame memory 1004, the display unit 1005, the recording unit 1006, and the operation unit 1007 to these supply targets.

In the electronic device 1000 configured in this manner, the saturation charge amount of a photodiode PD can be enhanced by applying the solid-state imaging element 1 of each of the above embodiments as the solid-state imaging element 1002.

Although the embodiments of the disclosure have been described above, the technical scope of the disclosure is not limited to the above embodiments as they are, and various modifications can be made without departing from the gist of the disclosure. In addition, components of different embodiments and modifications may be combined as required.

For example, in each of the above embodiments, an example in which each transistor and each internal gate are controlled between two levels of the ON state and the OFF state has been described, however, each transistor and each internal gate may be controlled among three or more levels.

Furthermore, the effects described herein are merely examples and are not limiting, and other effects may be achieved.

Note that the present technology can also have the following configurations.

(1)

A solid-state imaging element comprising:

a photoelectric conversion unit that photoelectrically converts incident light;

a transfer transistor that transfers a charge generated by the photoelectric conversion unit; and an internal gate that deepens a potential of at least a partial region in the photoelectric conversion unit, the internal gate being disposed adjacent to the transfer transistor inside the photoelectric conversion unit.

(2)

The solid-state imaging element according to the above (1), further comprising:

a charge holding unit that holds the charge transferred from the photoelectric conversion unit; and a floating diffusion that holds the charge transferred from the charge holding unit, wherein the transfer transistor transfers the charge generated by the photoelectric conversion unit to the charge holding unit.

(3)

The solid-state imaging element according to the above (2), further comprising:

another internal gate that deepens a potential of at least a partial region in the charge holding unit, the other internal gate being disposed adjacent to the transfer transistor inside the charge holding unit.

(4)

The solid-state imaging element according to any one of the above (1) to (3), further comprising:

a discharge transistor that discharges a charge remaining in the photoelectric conversion unit, wherein the internal gate is disposed adjacent to the discharge transistor.

(5)

The solid-state imaging element according to any one of the above (1) to (4), further comprising:

a plurality of the internal gates, wherein each of the plurality of the internal gates deepens a potential of one of regions adjacent to each other in the photoelectric conversion unit.

(6)

The solid-state imaging element according to any one of the above (1) to (5), wherein the internal gate deepens a potential of at least a partial region in the photoelectric conversion unit in a charge transfer period.

(7)

The solid-state imaging element according to any one of the above (1) to (5), wherein the internal gate deepens a potential of at least a partial region in the photoelectric conversion unit in a charge accumulation period and a charge transfer period.

(8)

An electronic device comprising:

a solid-state imaging element;

an optical system that captures incident light from a subject and forms an image on an imaging plane of the solid-state imaging element; and a signal processing circuit that performs processing on an output signal from the solid-state imaging element, wherein the solid-state imaging element comprises:

a photoelectric conversion unit that photoelectrically converts the incident light;

a transfer transistor that transfers a charge generated by the photoelectric conversion unit; and an internal gate that deepens a potential of at least a partial region in the photoelectric conversion unit, the internal gate being disposed adjacent to the transfer transistor inside the photoelectric conversion unit.

(9)

The electronic device according to the above (8), in which the solid-state imaging element further includes:

a charge holding unit that holds the charge transferred from the photoelectric conversion unit; and a floating diffusion that holds the charge transferred from the charge holding unit, and the transfer transistor transfers the charge generated by the photoelectric conversion unit to the charge holding unit.

(10)

The electronic device according to the above (9), in which the solid-state imaging element further includes another internal gate that deepens a potential of at least a partial region in the charge holding unit, the other internal gate being disposed adjacent to the transfer transistor inside the charge holding unit.

(11)

The electronic device according to any one of the above (8) to (10), in which the solid-state imaging element further includes a discharge transistor that discharges a charge remaining in the photoelectric conversion unit, and the internal gate is disposed adjacent to the discharge transistor.

(12)

The electronic device according to any one of the above (8) to (11), further including:

a plurality of the internal gates, in which each of the plurality of the internal gates deepens a potential of one of regions adjacent to each other in the photoelectric conversion unit.

(13)

The electronic device according to any one of the above (8) to (12), in which the internal gate deepens a potential of at least a partial region in the photoelectric conversion unit in a charge transfer period.

(14)

The electronic device according to any one of the above (8) to (12), in which the internal gate deepens a potential of at least a partial region in the photoelectric conversion unit in a charge accumulation period and a charge transfer period.

(15)

A control method of a solid-state imaging element, the method comprising:

a charge accumulation step of accumulating a charge generated by a photoelectric conversion unit by incident light in the photoelectric conversion unit; and a charge transfer step of transferring the charge accumulated in the photoelectric conversion unit by operating a transfer transistor, wherein the charge transfer step comprises a step of deepening a potential of a region adjacent to the transfer transistor in the photoelectric conversion unit.

(16)

The control method of a solid-state imaging element according to the above (15), wherein the charge accumulation step includes a step of deepening a potential of a region adjacent to the transfer transistor in the photoelectric conversion unit.

REFERENCE SIGNS LIST

1 SOLID-STATE IMAGING ELEMENT
10 PIXEL ARRAY UNIT

11 LIGHT RECEIVING PIXEL
FD FLOATING DIFFUSION
MEM CHARGE HOLDING UNIT
M1 FIRST REGION
M2 SECOND REGION
OFG DISCHARGE TRANSISTOR
OFD DISCHARGE FLOATING DIFFUSION
PB1 to PB3 POTENTIAL BARRIER
PD PHOTODIODE (EXAMPLE OF PHOTOELECTRIC CONVERSION UNIT)
PD1 FIRST REGION
PD2 SECOND REGION
PY, PY1, PY2 INTERNAL GATE
TX INTERNAL GATE (EXAMPLE OF ANOTHER INTERNAL GATE)
TY, TRG TRANSFER TRANSISTOR

The invention claimed is:

1. A solid-state imaging element, comprising:
a photoelectric conversion unit configured to generate a first charge by photoelectric conversion of incident light;
a charge holding unit;
a transfer transistor configured to transfer the first charge generated by the photoelectric conversion unit to the charge holding unit,
wherein the charge holding unit is configured to hold the first charge transferred from the transfer transistor;
a first internal gate configured to deepen a potential of a first region in the photoelectric conversion unit, wherein
the first internal gate is adjacent to the transfer transistor, and
the first internal gate is inside the photoelectric conversion unit;
a floating diffusion configured to:
receive the first charge from the charge holding unit; and
hold the received first charge; and
a second internal gate configured to deepen a potential of a region in the charge holding unit, wherein
the second internal gate is adjacent to the transfer transistor, and
the second internal gate is inside the charge holding unit.

2. The solid-state imaging element according to claim 1, further comprising a discharge transistor configured to discharge a second charge accumulated in the photoelectric conversion unit,
wherein the first internal gate is adjacent to the discharge transistor.

3. The solid-state imaging element according to claim 1, further comprising a plurality of internal gates that includes the first internal gate, the second internal gate, and a third internal gate, wherein
the third internal gate is configured to deepen a potential of a second region in the photoelectric conversion unit, and
the second region is adjacent to the first region.

4. The solid-state imaging element according to claim 1, wherein the first internal gate is further configured to deepen the potential of the first region in the photoelectric conversion unit in a charge transfer period of the transfer of the first charge by the transfer transistor.

5. The solid-state imaging element according to claim 4, wherein the first internal gate is further configured to deepen the potential of the first region in the photoelectric conversion unit in a charge accumulation period and the charge transfer period.

6. An electronic device, comprising:
a solid-state imaging element;
an optical system configured to:
capture incident light from a subject; and
form an image on an imaging plane of the solid-state imaging element based on the captured incident light,
wherein the solid-state imaging element is configured to output an output signal based on the formed image; and
a signal processing circuit configured to process the output signal,
wherein the solid-state imaging element comprises:
a photoelectric conversion unit configured to generate a charge by photoelectric conversion of the incident light;
a charge holding unit;
a transfer transistor configured to transfer the charge generated by the photoelectric conversion unit to the charge holding unit,
wherein the charge holding unit is configured to hold the charge transferred from the transfer transistor;
a first internal gate configured to deepen a potential of a region in the photoelectric conversion unit, wherein
the first internal gate is adjacent to the transfer transistor, and
the first internal gate is inside the photoelectric conversion unit;
a floating diffusion configured to:
receive the charge from the charge holding unit; and
hold the received charge; and
a second internal gate configured to deepen a potential of a region in the charge holding unit, wherein
the second internal gate is adjacent to the transfer transistor, and
the second internal gate is inside the charge holding unit.

7. A control method, comprising:
in a solid-state imaging element:
generating, by a photoelectric conversion unit of the solid-state imaging element, a charge by photoelectric conversion of incident light;
transferring, in a first charge transfer period, by a transfer transistor of the solid-state imaging element, the charge generated by the photoelectric conversion unit to a charge holding unit of the solid-state imaging element;
holding, by the charge holding unit, the charge transferred from the transfer transistor;
deepening, by a first internal gate of the solid-state imaging element, a potential of a region in the photoelectric conversion unit in the first charge transfer period, wherein
the first internal gate is adjacent to the transfer transistor, and
the first internal gate is inside the photoelectric conversion unit;
receiving, in a second charge transfer period, the charge from the charge holding unit by a floating diffusion of the solid-state imaging element;

holding, by the floating diffusion, the received charge; and deepening, by a second internal gate of the solid-state imaging element, a potential of a region in the charge holding unit in the second charge transfer period, wherein the second internal gate is adjacent to the transfer transistor, and the second internal gate is inside the charge holding unit.

8. The control method according to claim 7, further comprising deepening, by the first internal gate, the potential of the region in the photoelectric conversion unit in a charge accumulation period.

* * * * *